US006450116B1

(12) United States Patent
Noble et al.

(10) Patent No.: US 6,450,116 B1
(45) Date of Patent: *Sep. 17, 2002

(54) APPARATUS FOR EXPOSING A SUBSTRATE TO PLASMA RADICALS

(75) Inventors: David B. Noble, Sunnyvale; Ravi Jallepally, Santa Clara; Nathan D'Astici, Campbell; Gary Miner, Fremont; Turgut Sahin, Cupertino; Guangcai Xing, Fremont; Yashraj Bhatnagar, Santa Clara, all of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/439,476

(22) Filed: Nov. 12, 1999

Related U.S. Application Data

(63) Continuation-in-part of application No. 09/298,064, filed on Apr. 22, 1999.

(51) Int. Cl.[7] .............................. C23C 16/00; C23F 1/02
(52) U.S. Cl. ........................ 118/723 R; 118/723 MW; 118/50.1; 156/345.35; 156/345.36; 156/345.5
(58) Field of Search .............................. 118/724, 723 R, 118/723 ME, 723 ER, 723 IR, 50.1; 156/345

(56) References Cited

U.S. PATENT DOCUMENTS

| | | | |
|---|---|---|---|
| 4,401,054 A | | 8/1983 | Matsuo et al. |
| 4,724,159 A | * | 2/1988 | Yamazaki .................... 427/451 |
| 4,857,132 A | * | 8/1989 | Fisher ......................... 156/345 |
| 5,082,517 A | * | 1/1992 | Moslehi ...................... 156/345 |
| 5,138,973 A | | 8/1992 | Davis et al. |
| 5,294,571 A | | 3/1994 | Fujishiro et al. |
| 5,403,434 A | * | 4/1995 | Moslehi ...................... 156/643 |
| 5,685,949 A | * | 11/1997 | Yashima ................... 156/643.1 |
| 5,902,404 A | * | 5/1999 | Fong et al. .......... 118/723 ME |
| 6,029,602 A | * | 2/2000 | Bhatnagar ............ 118/723 ME |

FOREIGN PATENT DOCUMENTS

| | | |
|---|---|---|
| DE | 19611538 C | 8/1997 |
| EP | 0291181 A | 11/1988 |
| EP | 0326191 A | 8/1989 |
| EP | 0800200 A | 10/1997 |
| EP | 0886308 A | 12/1998 |
| EP | 0 973189 A | 1/2000 |
| JP | 06-333857 | 2/1994 |

OTHER PUBLICATIONS

Hattangady et al., "Controlled nitrogen incorporation at the gate oxide surface", Appl. Phys. Lett. vol. 66, No. 25, Jun. 19, 1995, pp. 3495–3497.

Kaluri et al., "Nitrogen incorporation in thin oxides by constant current $N_2O$ plasma anodization of silicon and $N_2$ plasma nitridation of silicon oxides", Appl. Phys. Lett. vol. 69, No. 8, Aug. 19, 1996, pp. 1053–1055.

Kaluri et al., "Constant Current $N_2O$ Plasma Anodization of Silicon", J. Electrochem. Soc. vol. 144, No. 6, Jun. 1997, pp. 2200–2205.

Kraft et al., "Surface nitridation of silicon dioxide with a high density nitrogen plasma", J. Vac. Sci. Technol, B. vol. 15, No. 4, Jul./Aug. 1997, pp. 967–970.

* cited by examiner

*Primary Examiner*—Gregory Mills
*Assistant Examiner*—Luz L. Alejandro
(74) *Attorney, Agent, or Firm*—Blakely, Sokoloff, Taylor & Zafman

(57) ABSTRACT

An apparatus and method for exposing a substrate to plasma including a first reaction chamber adapted to generate a plasma comprising ions and radicals and a second reaction chamber coupled to the first reaction chamber and adapted to house a substrate at a sight in the second reaction chamber. The second reaction chamber is coupled to the first reaction chamber by an inlet member and radicals of the plasma flow through the inlet member into the second reaction chamber.

30 Claims, 11 Drawing Sheets

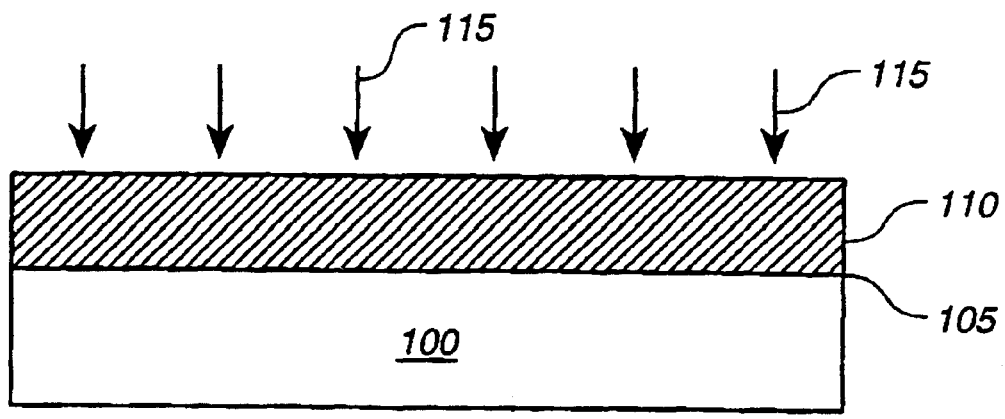
FIG._1
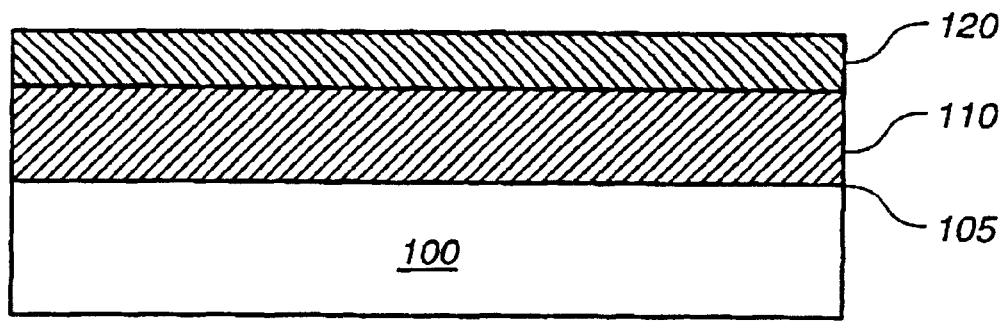
FIG._2
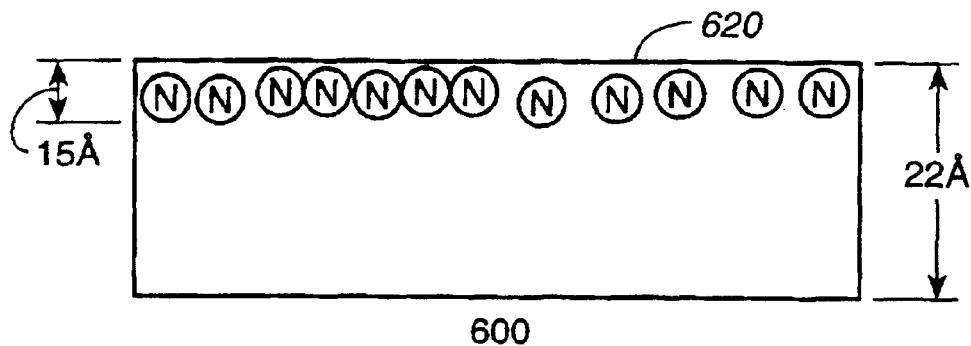
FIG._12

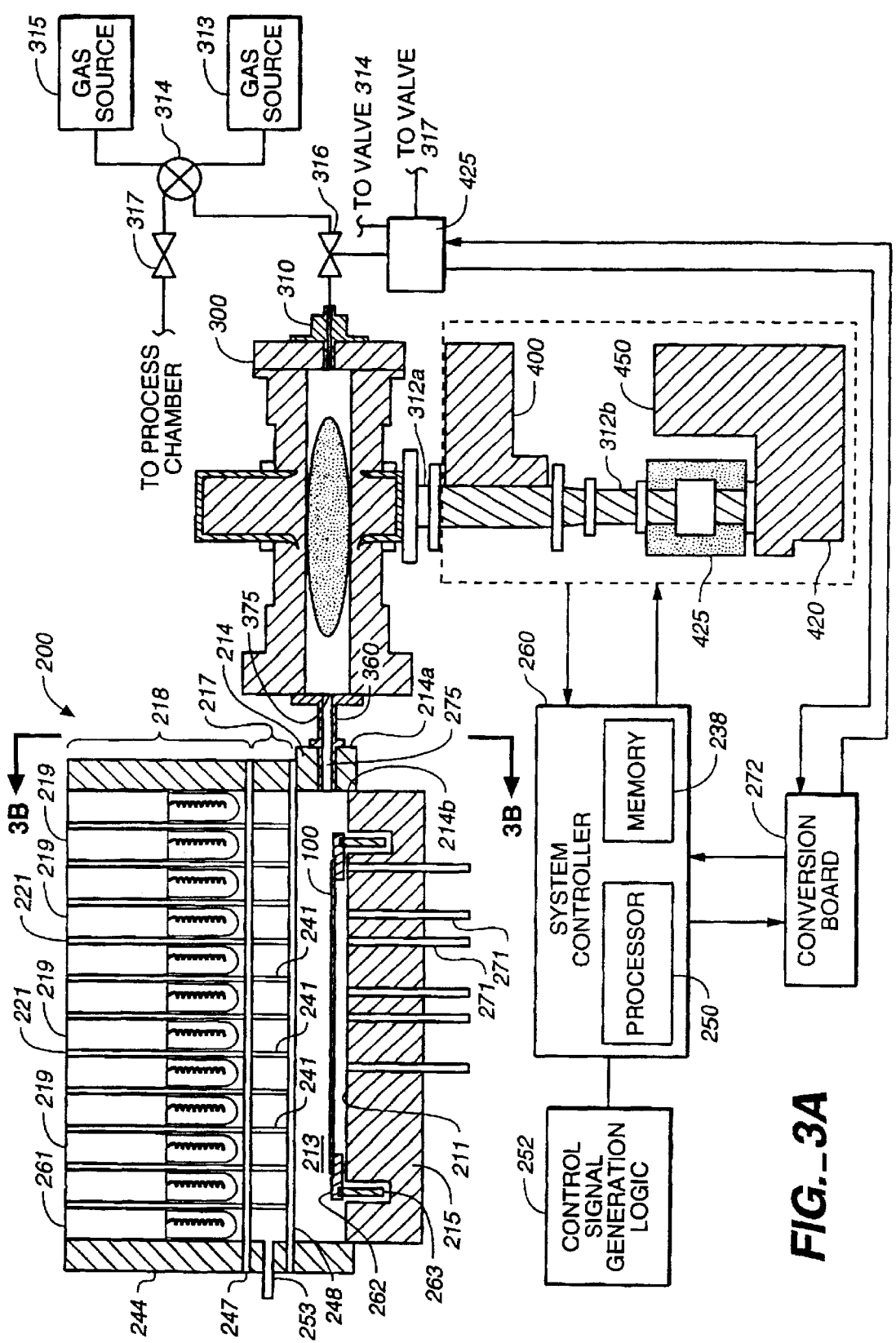
FIG._3A

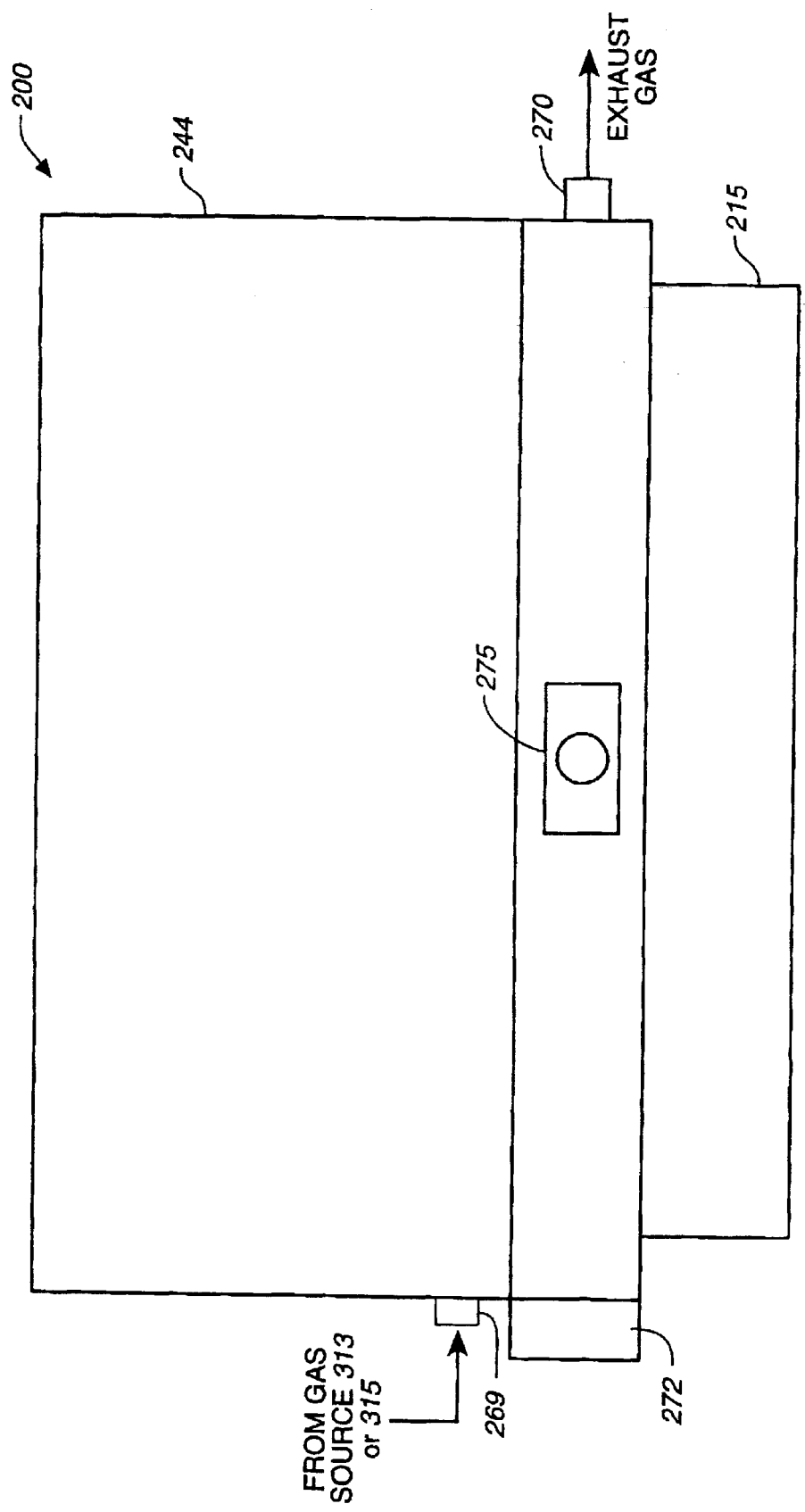
FIG._3B

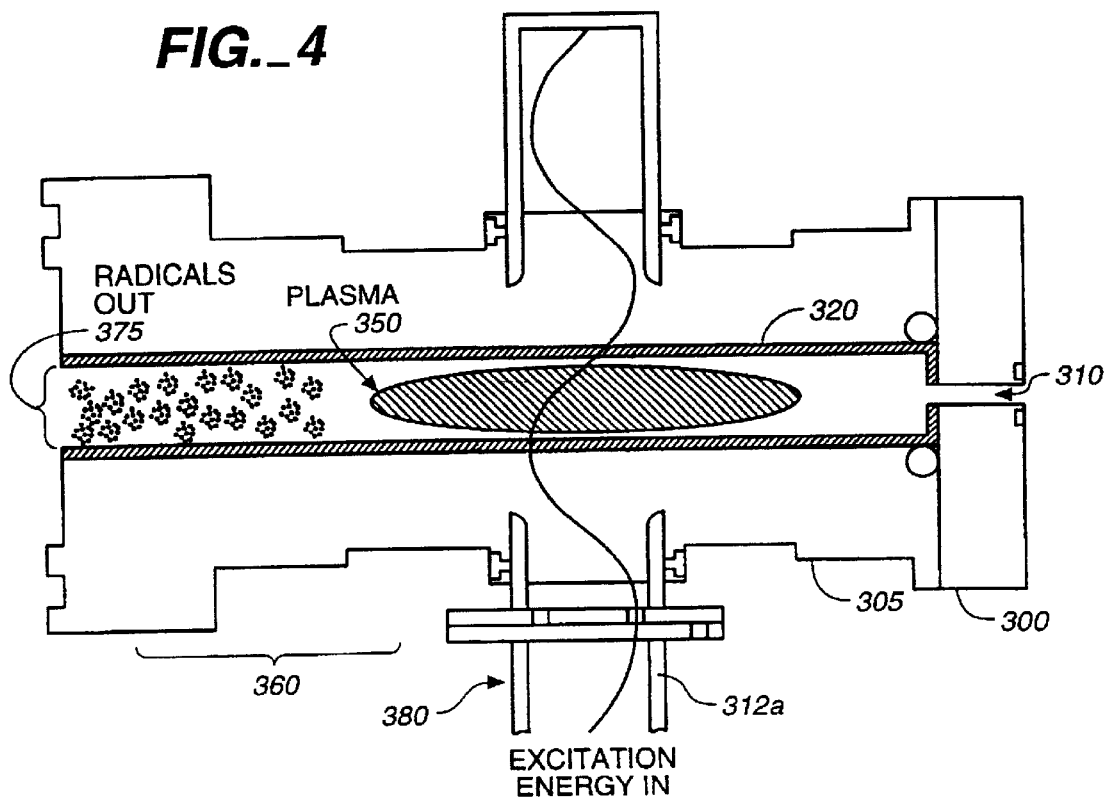
FIG._4
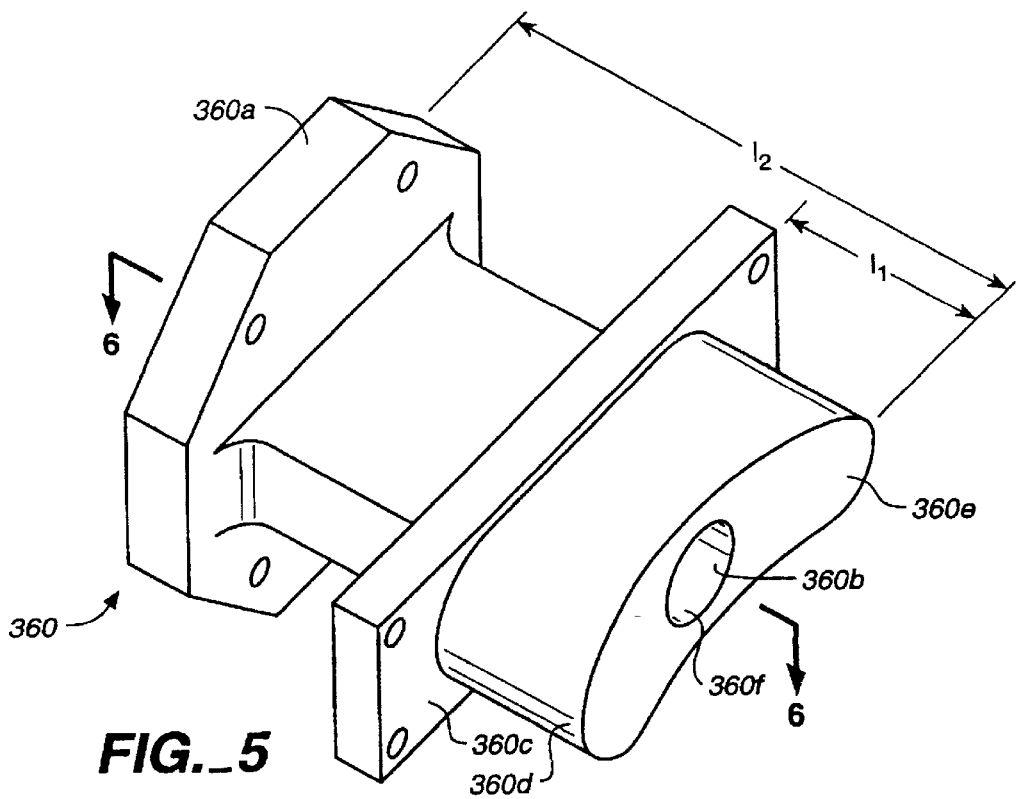
FIG._5

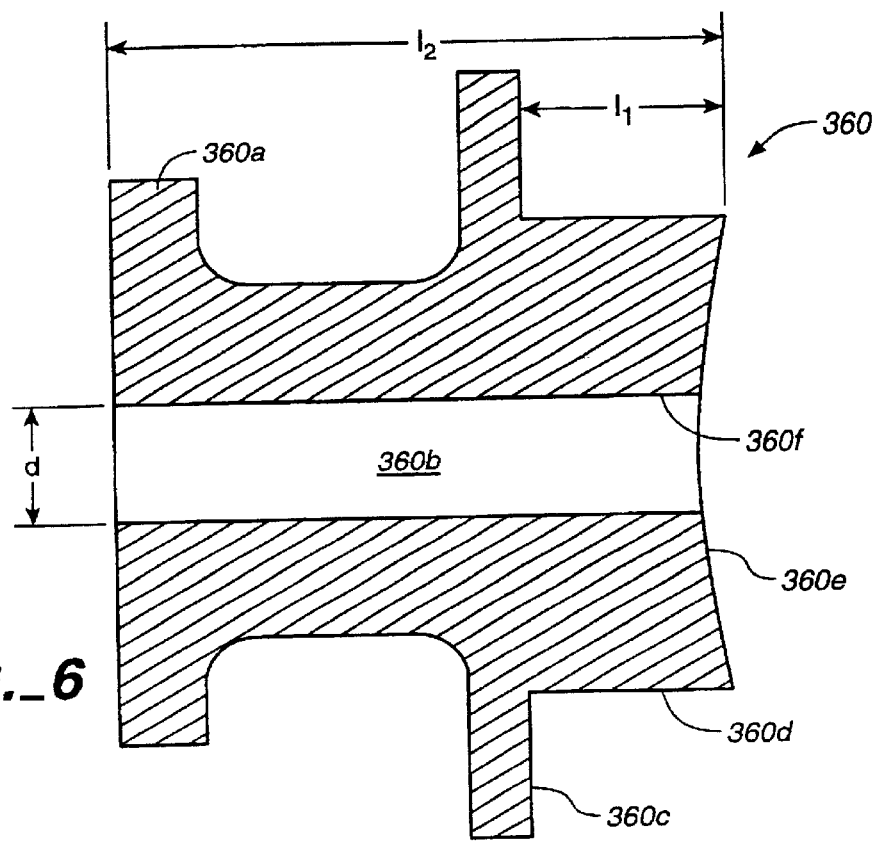
FIG._6
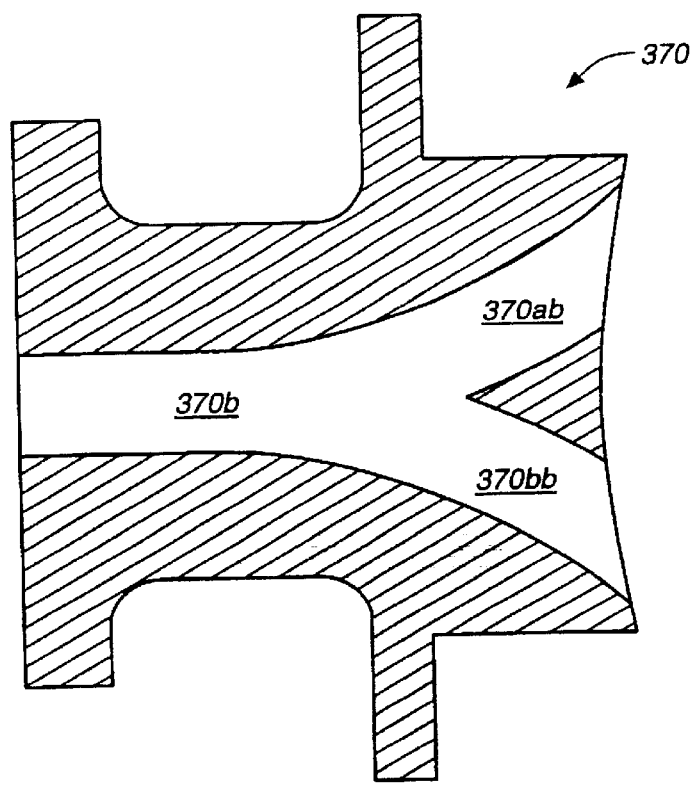
FIG._7

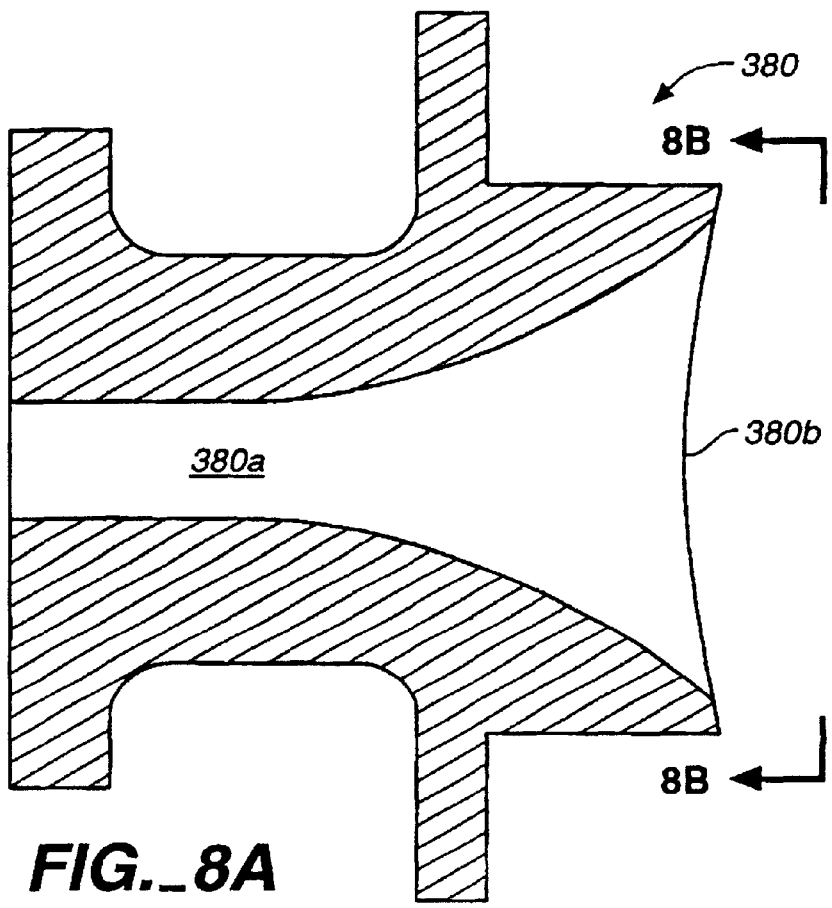
FIG._8A
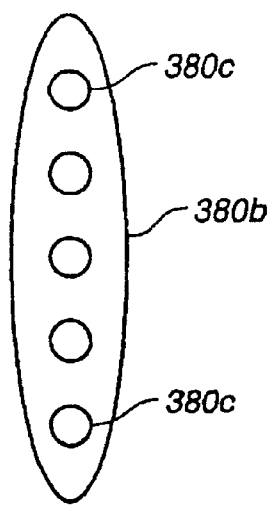
FIG._8B

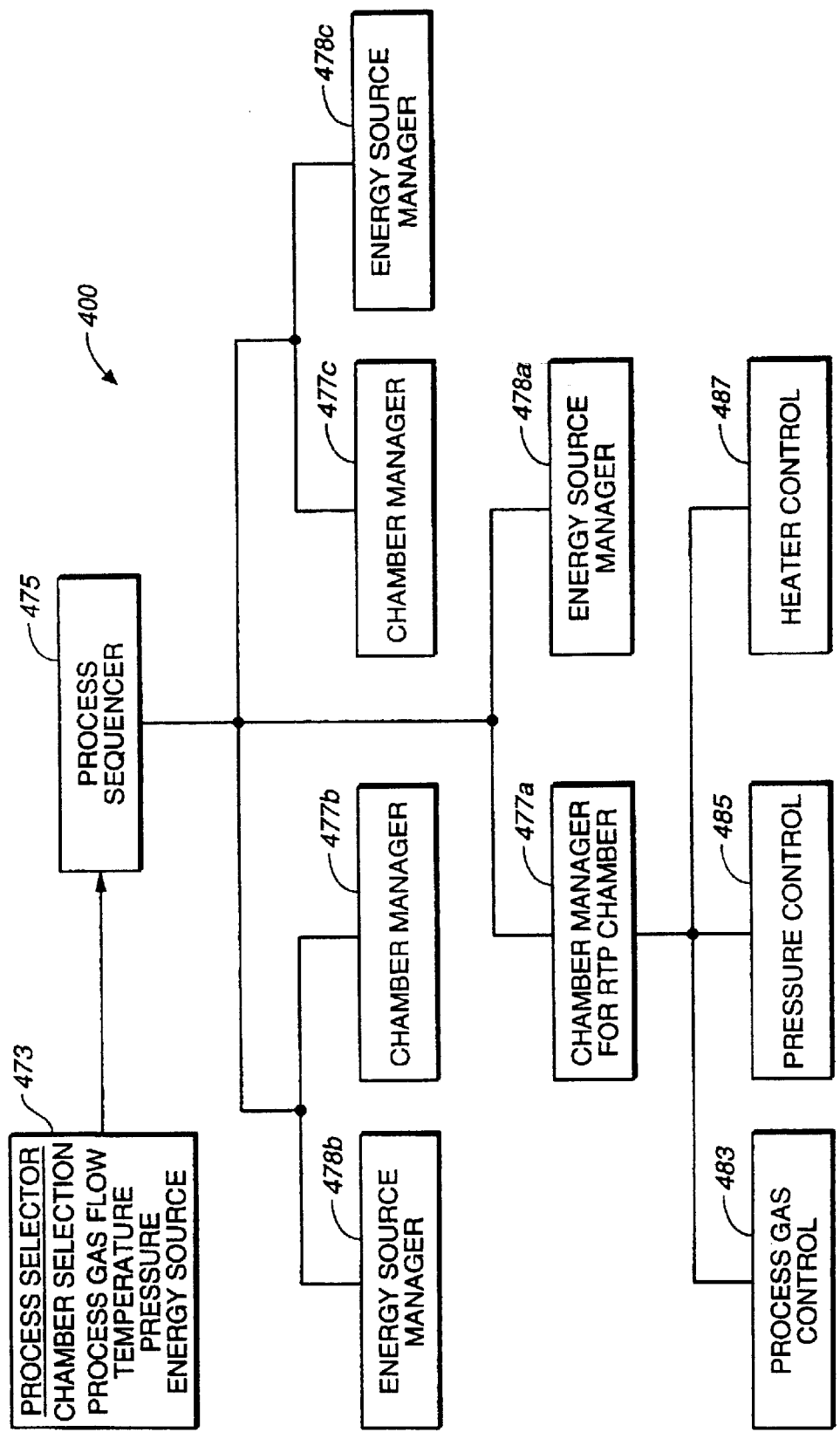
FIG._9

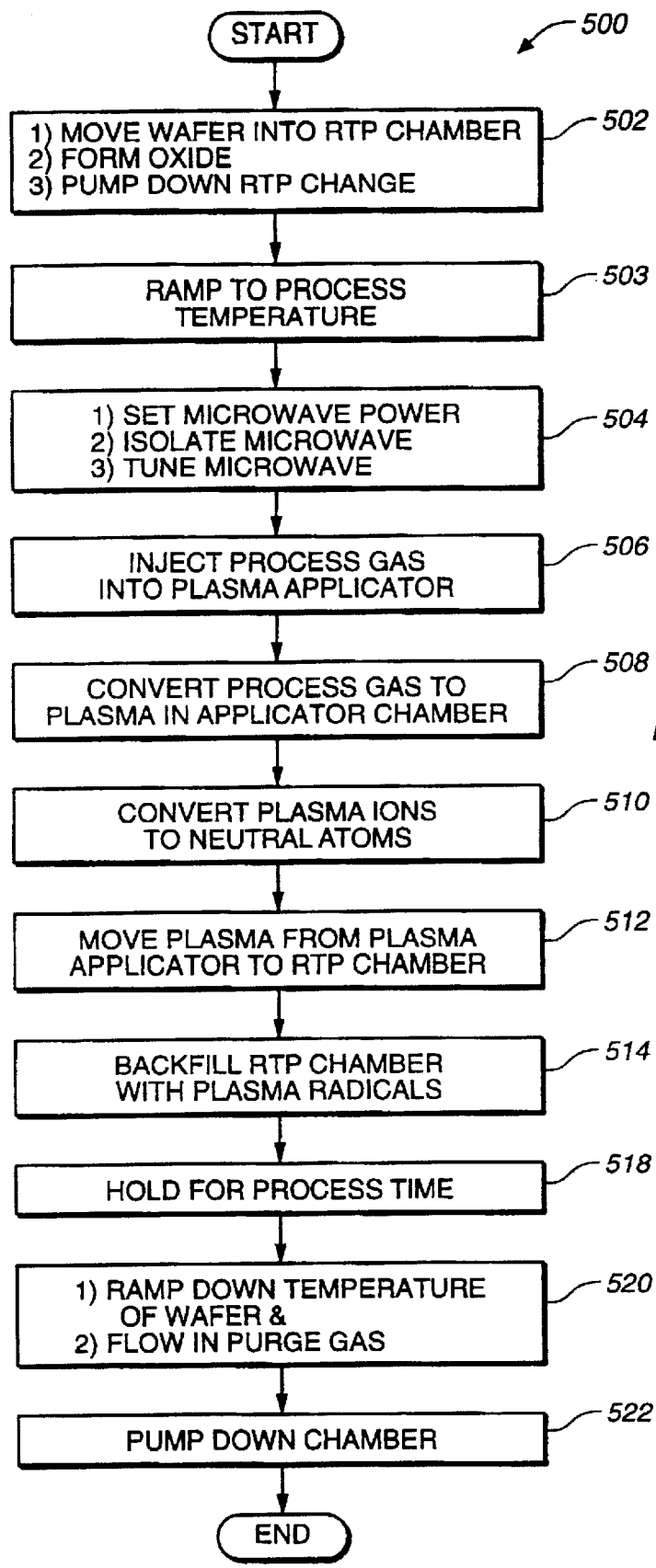
FIG._10

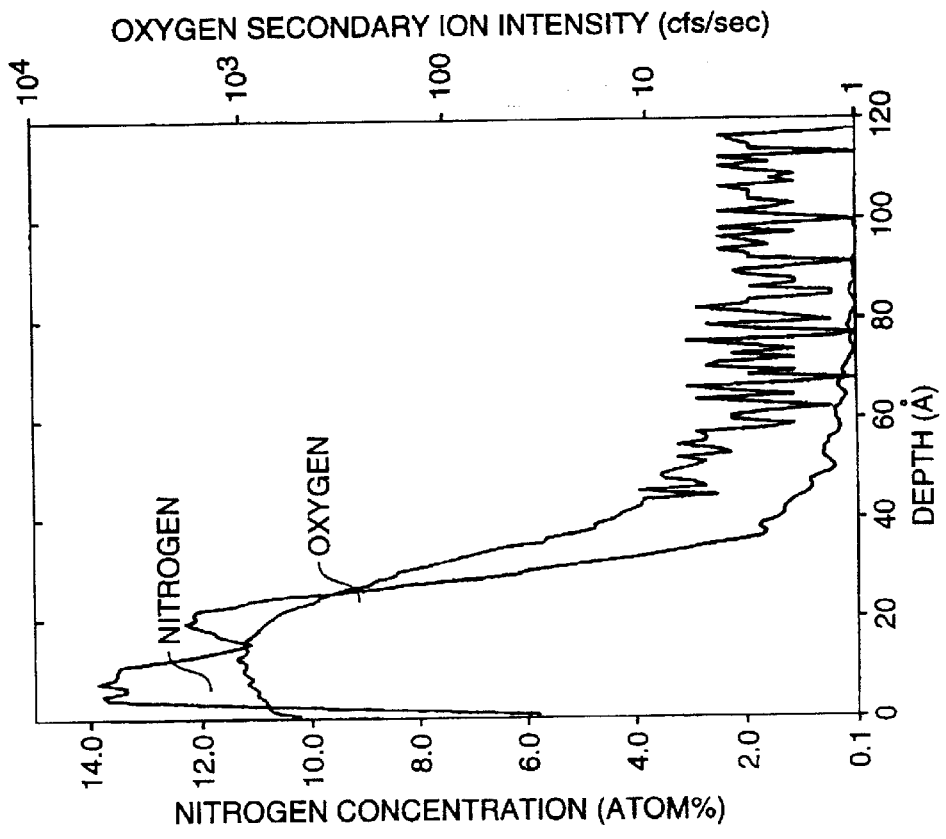
FIG._13
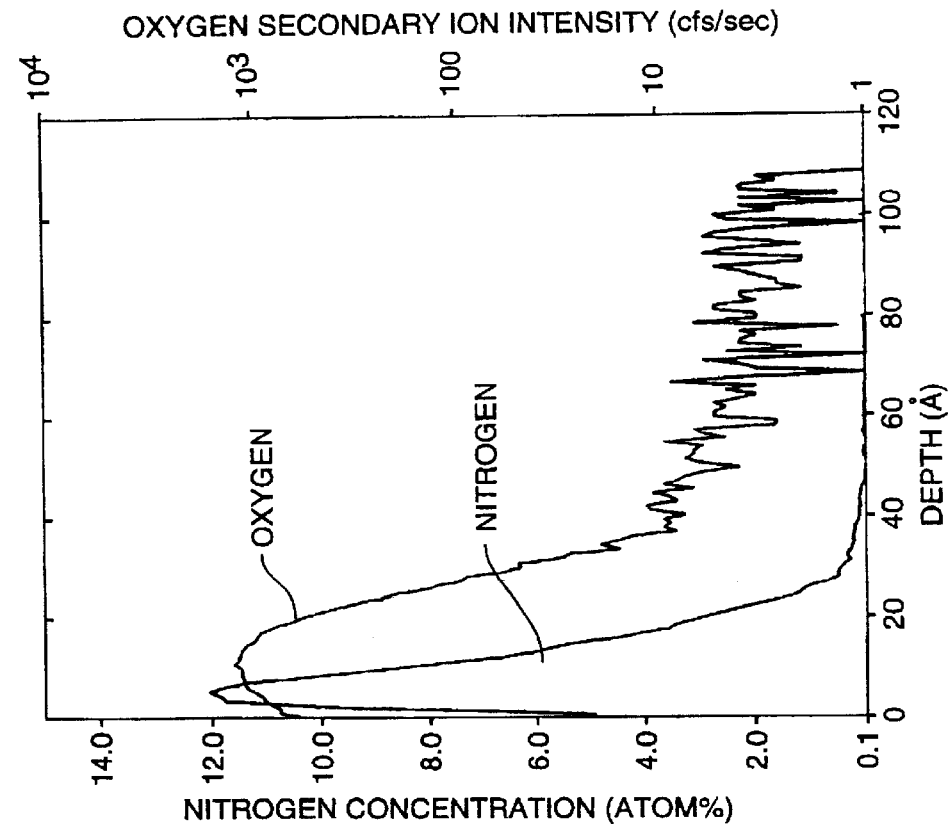
FIG._11

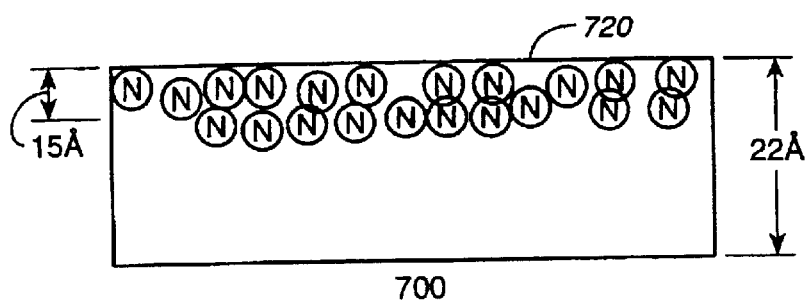
FIG._14
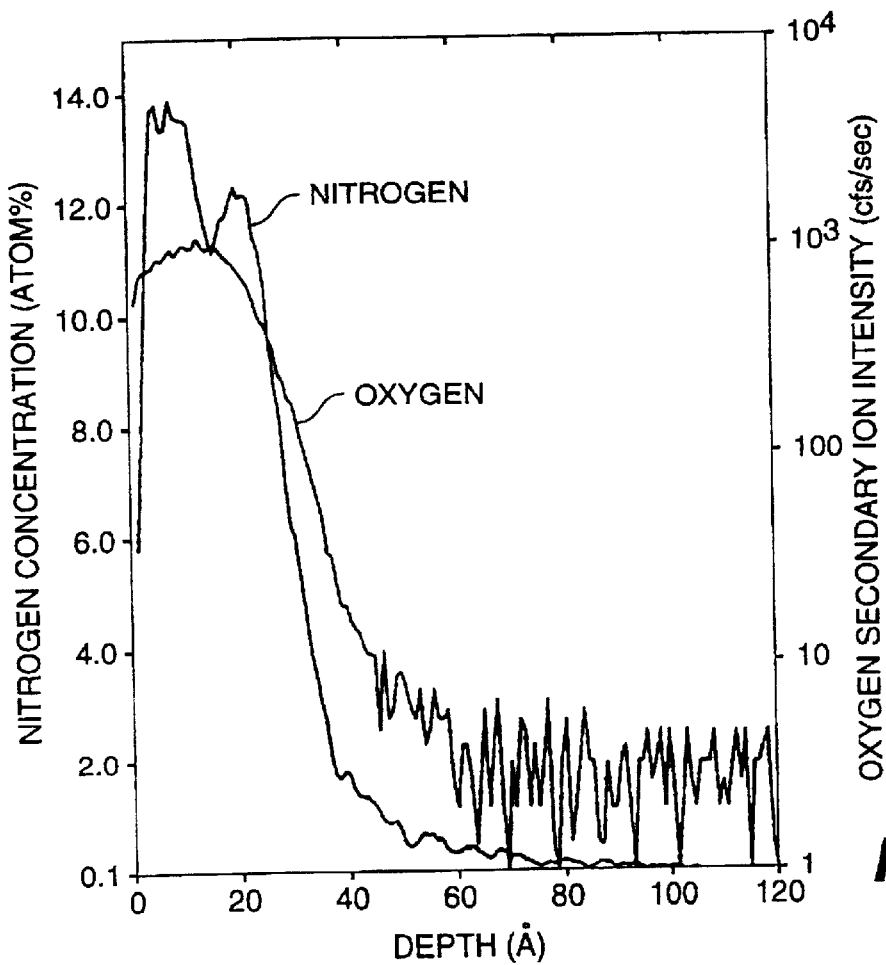
FIG._15
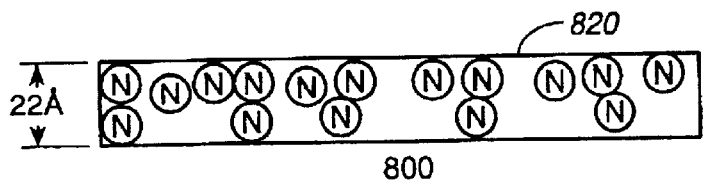
FIG._16

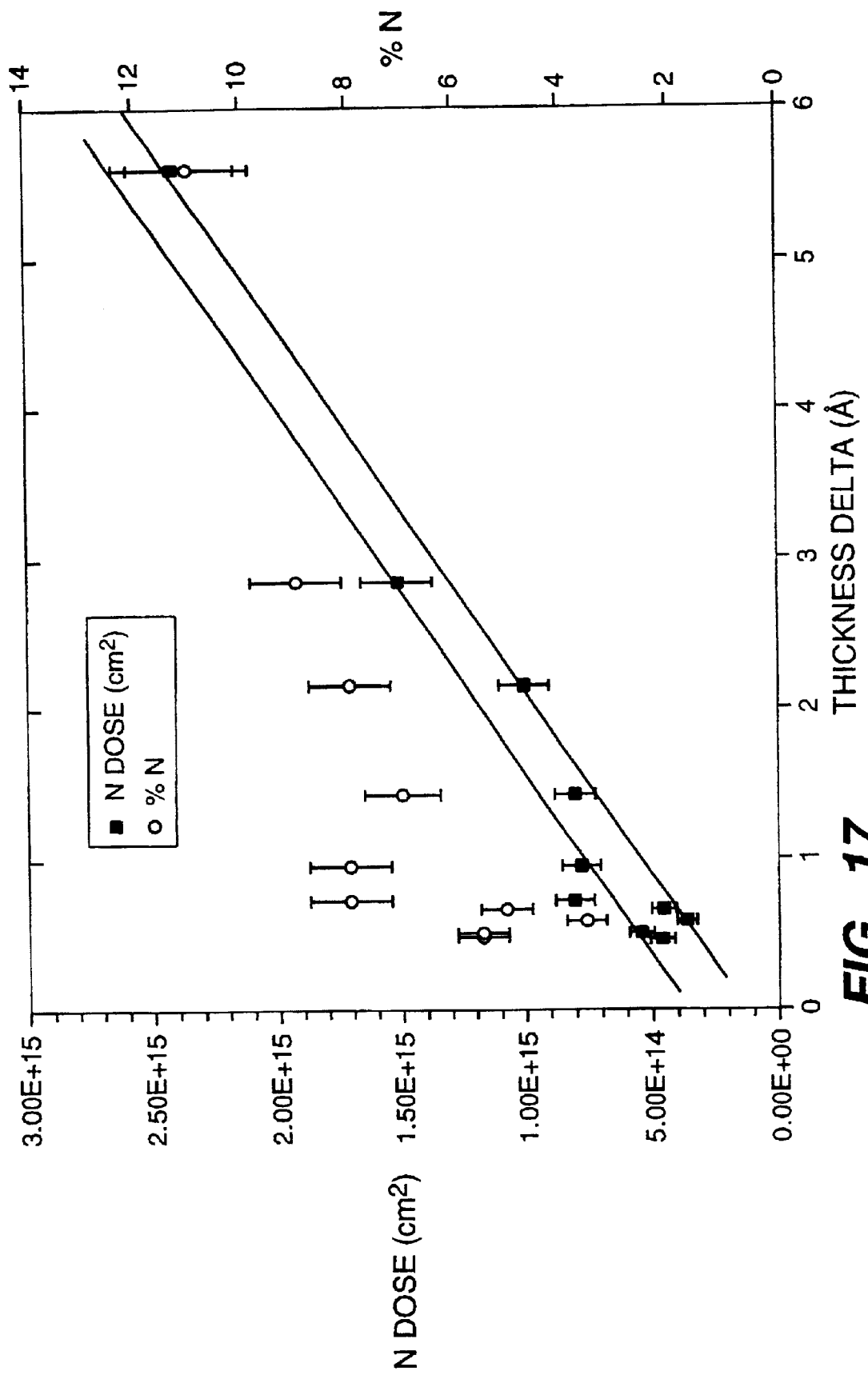
FIG._17

APPARATUS FOR EXPOSING A SUBSTRATE TO PLASMA RADICALS

This application is a continuation-in-part of application Ser. No. 09/298,064, filed Apr. 22, 1999 and entitled "Apparatus and Method for Exposing a Substrate to Plasma Radicals," which is incorporated herein by reference.

BACKGROUND OF THE INVENTION

The invention relates to the field of wafer or substrate plasma reactions, and more specifically to an apparatus and method for exposing a wafer or substrate to a plasma.

In the fabrication of modern integrated circuits, such as microprocessors and memories, oxidation processes are used to passivate or oxidize semiconductor films. Popular methods to oxidize silicon surfaces and films, such as, for example, polysilicon gate electrodes and substrates, include pure oxygen ($O_2$) and water vapor or steam ($H_2O$) oxidation processes. In either case, the oxygen or water vapor is brought into a chamber to react with the silicon-containing surfaces to form silicon dioxide ($SiO_2$).

In many oxidation processes for ultra-high performance integrated circuit applications, a pure $SiO_2$ film may not be desirable as the final structure. For example, although an $SiO_2$ film may provide adequate insulative properties, thin $SiO_2$ films have been found to be penetrable by dopants leading to undesirable results. For example, in complementary metal oxide semiconductor (CMOS) circuits, gate doping is used, in part, to lower the threshold voltage ($V_T$) associated with an individual transistor device. Thus, for example, a polysilicon gate will be doped with boron as part of a PMOS device, or phosphorous, arsenic or antimony as part of an NMOS device. As the gate oxide beneath the polysilicon gate gets smaller, for example in the range of 0.10–0.20 microns or less, dopants implanted into the gate, particularly boron, diffuse or migrate through the gate oxide, particularly during a high temperature annealing activation step conventionally performed to activate the dopants in the diffusion or junction regions. In the case of boron in the gate, some of the boron diffuses through the gate oxide and gets deposited in the channel beneath the gate oxide adding more charge to the channel. The additional charge becomes scattering centers to charge carriers conducting the current. The scattering creates electric field changes that degrade the mobility of the device. The diffusion of the boron into the channel also unacceptably modifies the $V_T$ away from the predicted value for a device.

To prevent dopants from diffusing through thin oxides, such as boron through a thin gate oxide, prior art processes have incorporated nitrogen-containing sources such as nitrous oxide ($N_2O$), nitrogen oxide (NO), and ammonia ($NH_3$). The nitrogen-containing material forms a film or layer (typically a silicon nitride ($Si_3N_4$) or a silicon oxynitride ($Si_xN_yO_z$) film or layer) that acts as a barrier layer to prevent the diffusion of dopants through the oxide.

In the case of gate oxides, some prior art methods place nitrogen-containing materials or films at the gate oxide/substrate interface. A prior art NO growth and anneal method, for example, typically results in a high nitrogen incorporation (up to nine percent) at a gate oxide/silicon substrate interface. The nitrogen acts as an excellent diffusion barrier, but the nitrogen present in such high percentage at the interface degrades channel mobility. Other prior art methods contaminate the oxide or do not provide a significant penetration barrier to dopants. For example, an $NH_3$ anneal forms a good barrier layer to diffusing dopants, but the reliability of the device is degraded due to hydrogen incorporation. A prior art $N_2O$ growth or anneal method incorporates less than three percent nitrogen at the substrate interface, but does not provide a good enough penetration barrier for thin gate oxides.

What is needed is a method and apparatus for incorporating a barrier material on an oxide that may be accomplished in a thermally efficient manner and that does not degrade device performance.

SUMMARY OF THE INVENTION

The invention, in one aspect, features a first reaction chamber and a gas source coupled to the first reaction chamber to supply a gas to the first reaction chamber including constituents adapted to react with a substrate in a process step. An excitation energy source is coupled to the first reaction chamber to generate a plasma including ions and radicals from the gas. A second reaction chamber is provided to house a substrate at a site in the second reaction chamber wherein the first reaction chamber is coupled to the second reaction chamber by an inlet member and radicals of the plasma flow through the inlet member into the second reaction chamber. The inlet member includes a passageway having a cross-sectional dimension selected such that during processing the pressure in the second reaction chamber is less than the pressure in the first reaction chamber.

Embodiments of the invention may include one or more of the following features. The second reaction chamber is a rapid thermal processing chamber. The excitation energy source includes a microwave cavity and a microwave generator to provide a microwave field to the microwave cavity. The inlet member includes a main passageway and two passageways which diverge from the main passageway in a direction toward the substrate site in the second reaction chamber. Alternatively, the inlet member includes a main passageway and a face thereof including a plurality of openings. The inlet member passageway is coupled to an output end of the excitation energy source and a sleeve is located in the passageway. The sleeve is made of a material different from the inlet member. For example, the sleeve may be made of silicon, silicon nitride, boron nitride, carbon nitride, or $Al_2O_3$.

The invention may further include a rapid thermal processing chamber coupled to the first reaction chamber by a load lock. Additionally, the pressure in the second reaction chamber may be between about 0.50 and 4.0 Torr, while the pressure in the first reaction chamber may be between about 1.0 and 8 Torr.

In another aspect, the invention is directed to an apparatus wherein the inlet member is configured to fit within a preexisting opening in a wall of a second reaction chamber, with radicals of a plasma flowing from a first reaction through the inlet member and into the second reaction chamber.

An interior wall of the second reaction chamber may be curved with a face of the inlet member also curved to substantially correspond to the curvature of the interior wall. An orifice may be provided at an outlet of the first reaction chamber and a cross-sectional dimension of the orifice selected to provide a pressure in the first reaction chamber which is greater than the pressure in the second reaction chamber during processing.

The invention also features, in another aspect, an apparatus for nitridation, including a process chamber in which a substrate can be positioned during processing. A first inlet into the process chamber is provided through which a first process gas can be introduced into the process chamber from a first process gas source. A second process gas source is coupled to a second reaction chamber to supply a second process gas thereto. An excitation energy source is coupled to the reaction chamber to generate a discharge in the second process gas as it flows from the second process gas source through the reaction chamber. An inlet member is coupled between an outlet of the reaction chamber and a second inlet into the process chamber. The inlet member includes a passageway having a cross-sectional dimension selected such that during processing the pressure in the process chamber is less than the pressure in the reaction chamber. The inlet member is configured to fit within a preexisting opening in a wall of the process chamber. The second process gas may comprise nitrogen or a mixture of nitrogen and helium. A valve may be used to selectively provide fluid communication between the first inlet and the first process gas source, and the second inlet and the second process gas source.

In the example of a nitridation reaction in which nitrogen plasma is incorporated into an oxide on the substrate, the nitrogen radicals of a nitrogen plasma rapidly react with the oxide to incorporate nitrogen into the exposed surface of the oxide. In terms of barrier layer protection to a gate oxide, the nitrogen is incorporated primarily in the exposed surface of the oxide and not at the gate oxide/substrate interface. In this manner, the presence of an adequate amount of nitrogen to act as a barrier layer, disposed away from the substrate interface, will reduce the scattering centers caused by otherwise penetrable dopants without deleterious effects on channel mobility.

In another aspect, the invention feature a method for remote plasma nitridation. The method comprises generating a plasma including ions and radicals in a reaction chamber and providing a substrate having an oxide thereon in a rapid thermal processing chamber remote from the reaction chamber. The radicals of the plasma are transferred from the reaction chamber into the rapid thermal process chamber wherein the pressure within the reaction chamber is greater than the pressure in the rapid thermal processing chamber. A portion of the oxide and a portion of the plasma in the rapid thermal processing chamber are reacted and a nitrogen-containing material is formed in a portion of the oxide on the substrate.

In one embodiment, the pressure in the rapid thermal processing chamber is about 0.50 to 4.0 Torr and the pressure in the reaction chamber is about 1.0 to 8.0 Torr.

In another aspect, the invention features a method for remote plasma nitridation including generating a plasma in a reaction chamber from a gas including a mixture of nitrogen and an inert gas. The plasma includes ions and radicals. The radicals of the plasma are transferred into a rapid thermal processing chamber and a portion of an oxide layer on a substrate and a portion of the plasma are reacted to nitrate a portion of the oxide layer.

The inert gas, in one embodiment, may be helium. The gas mixture may comprise no more than about 95 percent helium. Specifically, the gas mixture may comprise between about 20 to 80 percent helium.

In another aspect, the invention features a method for remote plasma nitridation, comprising generating a plasma including ions and radicals in a reaction chamber and providing a substrate having an oxide thereon in a rapid thermal processing chamber remote from the reaction chamber. Radicals of the plasma are transferred into the rapid thermal processing chamber and a portion of the oxide and a portion of the plasma in the rapid thermal processing chamber are reacted at a temperature of between about 800 and 1,100° C. for a period between about 60 and 300 seconds to form a nitrogen-containing material in a portion of the oxide on the substrate.

The reacting step, in one embodiment, can take place at a temperature of about 1000° C. for about 240 seconds. The step of forming a nitrogen-containing material includes forming one of a silicon nitride and a silicon oxynitride.

In another aspect, the invention features a method comprising positioning a substrate in a rapid thermal processing chamber and introducing a first process gas into the processing chamber through a first gas inlet to deposit a film on the substrate. A second process gas is introduced into a reaction chamber remote from the processing chamber to generate a plasma of the second process gas. The plasma flows from the reaction chamber into the processing chamber through a second gas inlet at a first pressure which is greater than a second pressure in the processing chamber to alter the dielectic properties of a film on the substrate.

In the case of a nitrogen plasma, for example, the method uses a nitrogen plasma to create nitrogen radicals that can be used to incorporate nitrogen into an oxide such as, for example, to act as a barrier layer as described above. The method is useful to incorporate nitrogen into gate oxides and create barrier layers to penetrable gate dopants because, in one embodiment, the incorporated nitrogen does not migrate to the gate oxide/substrate interface. The barrier layer may therefore be created without the deleterious effects on gate performance associated with prior art methods, such as channel mobility degradation.

Additional features and benefits of the invention will become apparent from the detailed description, figures, and claims set forth below.

BRIEF DESCRIPTION OF THE DRAWINGS

FIG. 1 is a cross-sectional schematic illustration of a semiconductor substrate having an oxide layer undergoing a nitridation by radicals of a plasma in accordance with an embodiment of the invention.

FIG. 2 shows the substrate of FIG. 1 after the processing step of forming a nitride film on or in the surface of the oxide layer in accordance with an embodiment of the invention.

FIG. 3A is a schematic illustration of a remote plasma system in accordance with an embodiment of the invention including a system controller, a rapid thermal heating apparatus containing a wafer, a plasma applicator and a microwave source.

FIG. 3B is a schematic view along line 3B—3B of FIG. 3A.

FIG. 4 is a schematic illustration of a plasma applicator for use in supplying radicals of a plasma to a reaction or process chamber in accordance with an embodiment of the invention.

FIG. 5 is a schematic illustration of an inlet member for use in supplying radicals of a plasma to a reaction or process chamber in accordance with an embodiment of the invention.

FIG. 6 is a view along line 6—6 of FIG. 5.

FIG. 7 is a schematic illustration of an alternate embodiment of the inlet member of FIG. 5.

FIG. 8A is a schematic illustration of yet another embodiment of the inlet member of FIG. 5.

FIG. 8B is a view along line 8B—8B of FIG. 8A.

FIG. 9 is an illustrative block diagram of the hierarchical control structure of the control signal generation logic to operate the process system according to an embodiment of the invention.

FIG. 10 is a flowchart that illustrates a remote plasma nitridation process in accordance with an embodiment of the invention.

FIG. 11 is a Secondary Ion Mass Spectroscopy (SIMS) profile of a silicon substrate containing a dielectric layer formed by the nitridation of an oxide by a remote plasma source under a first set of reaction conditions in accordance with an embodiment of the invention.

FIG. 12 is a schematic illustration of a dielectric layer overlying a silicon substrate, the dielectric layer formed by the plasma nitridation of an $SiO_2$ layer on a substrate according to the first set of reaction conditions.

FIG. 13 is a SIMS profile of a silicon substrate containing a dielectric layer formed by the nitridation of an oxide by a remote plasma source under a second set of reaction conditions in accordance with an embodiment of the invention.

FIG. 14 is a schematic illustration of a dielectric layer overlying a silicon substrate, the dielectric layer formed by the plasma nitridation of an $SiO_2$ layer on a substrate according to the second set of reaction conditions.

FIG. 15 is a SIMS profile of a silicon substrate containing a dielectric layer formed by the nitridation of an oxide by a remote plasma source under a third set of reaction conditions in accordance with an embodiment of the invention.

FIG. 16 is a schematic illustration of a dielectric layer overlying a silicon substrate, the dielectric layer formed by the plasma nitridation of an $SiO_2$ layer on a substrate according to the third set of reaction conditions.

FIG. 17 is a plot of optical thickness delta versus nitrogen dose for use in correlating the nitrogen dose with the optical thickness.

DETAILED DESCRIPTION

The invention describes an apparatus and method for incorporating a plasma into a substrate or a material on a substrate using a remote plasma source. In general, plasma sources generated by, for example, an energetic excitation of gaseous molecules consist of a plasma of charged ions, radicals, and electrons. The invention recognizes that radicals of a plasma react in a much more desirable manner with a substrate or a material on a substrate, such as an oxide, than ions or a mixture of radicals and ions. In that regard, the invention describes the plasma source as remote to provide an apparatus and a method of eliminating the majority of the ions of the plasma such that preferably only the radicals of the plasma react with a substrate or material on a substrate.

In the following description, numerous specific details such as apparatus configurations as well as process specifics such as time and temperature are set forth in order to provide a thorough understanding of the invention. One skilled in the art will appreciate the ability to use alternative configurations and process details to the disclosed specifics without departing from the invention. In other instances, well known semiconductor processing equipment and techniques have not been described in detail in order to not unnecessarily obscure the invention.

FIGS. 1 and 2 illustrate an embodiment of the method of the invention. FIG. 1 shows a layer 110, such as for example, silicon dioxide ($SiO_2$) layer 110 overlying substrate 100. In one embodiment, $SiO_2$ layer 110 will serve as a gate oxide to insulate a transistor gate from the substrate. Substrate 100 is, for example, a silicon substrate 100. In FIG. 1, $SiO_2$ layer 110 is bombarded by a plasma 115. The reactive portion of plasma 115 is comprised substantially of radicals. The invention contemplates that substantially all ions present in the plasma at the plasma generation (with the radicals) are eliminated prior to coming in contact with $SiO_2$ layer 110. One way positively charged ions are eliminated is by combining with electrons (also present in the plasma at the plasma generation) to return to a non-ionic or charge neutral state. A plasma may be substantially free of the majority of the ions by separating the plasma generation source from the substrate location, e.g., the reaction site, by a distance longer than the lifetime of the ions at a given plasma discharge rate. In this manner, the radicals survive the travel distance to substrate 100, but ions do not, but instead lose their ionic character and become charge neutral.

In one embodiment, $SiO_2$ layer 110 is a gate oxide and the plasma is a nitrogen plasma incorporating nitrogen into the gate oxide to act as a barrier layer. FIG. 2 shows substrate 100 after the reaction between the radicals of the plasma and $SiO_2$ layer 110. FIG. 2 schematically illustrates the formation of, for example, a nitrogen-containing material or layer 120 overlying $SiO_2$ layer 110. A nitrogen plasma of nitrogen radicals (N*) reacts primarily with the oxide or displaces oxygen at the surface of $SiO_2$ layer 110 to yield a dielectric layer (i.e., $SiO_2$ layer 110 plus nitrogen-containing material or layer 120) having a significantly greater concentration of nitrogen-containing material at the surface of the dielectric layer as opposed to interface 105 between the dielectric layer and substrate 100. In this manner, the presence of nitrogen-containing material in the dielectric acts as an effective barrier to prevent the penetration of dopants, such as boron, through $SiO_2$ layer 110. Since the nitrogen-containing material or layer 120 is not present in significant amounts at interface 105, the negative effects on device performance seen in prior art structures should not be encountered.

It is to be appreciated that the invention is not limited to a process that results in a strict placement of a film or layer at the reaction surface, i.e., that the plasma reaction takes place in such a way to produce distinct layers of plasma-containing material and oxide. Instead, as will be discussed in detail below, in certain embodiments, the radicals of the plasma react and interact, for example, within the oxide during the exposure of the radicals to the reaction surface. In the case of a nitridation of a gate oxide, for example, the nitrogen-containing material is produced effectively in or on $SiO_2$ layer 110 by exposing $SiO_2$ layer 110 to a plasma of predominantly N* radicals. One theory is that N* radicals displace oxygen atoms in $SiO_2$ layer 110 to form $Si_3N_4$ and $Si_xO_yN_z$ material.

FIGS. 3A and 3B illustrate one embodiment of an apparatus or system used to react a plasma of predominantly radicals of a plasma with a substrate such as substrate 100 containing a material layer such as $SiO_2$ layer 110. The apparatus or system includes a rapid thermal processing (RTP) apparatus 200, such as, but not limited to, the Applied Materials, Inc., RTP Centura® with a Honeycombed Source™. Such a suitable RTP apparatus and its method of operation are set forth in U.S. Pat. No. 5,155,336, assigned to the assignee of the invention, and which is incorporated herein by reference. Other types of thermal reactors may be substituted for the RTP apparatus such as, for example, the Epi or Poly Centur® Single Wafer "Cold Wall" Reactor by Applied Materials used to form high temperature films, such as epitaxial silicon, polysilicon, oxides, and nitrides. The DielectricxZ™ chamber by Applied Materials is also suitable.

Coupled to RTP apparatus 200 is a plasma applicator 300 to provide radicals of a plasma to RTP apparatus 200. Coupled to plasma applicator 300 is an energy source 450 to generate an excitation energy to create a plasma.

In the embodiment illustrated in FIGS. 3A and 3B, RTP apparatus 200 includes a process chamber 213 enclosed by a side wall 214 and a bottom wall 215. Side wall 214 and bottom wall 215 may be made of stainless steel. The upper portion of side wall 214 of chamber 213 is sealed to a window assembly 217 by "O" rings. A radiant energy light pipe assembly or illuminator 218 is positioned over and coupled to window assembly 217. Light pipe assembly 218 includes a plurality of tungsten halogen lamps 219, for example, Sylvania EYT lamps, each mounted into, for example, light pipes 221 that can be made of stainless steel, brass, aluminum, or other metals.

Wafer or substrate 100 is supported on an edge inside chamber 213 by a support ring 262 typically made of silicon carbide. Support ring 262 is mounted on a rotatable quartz cylinder 263. By rotating quartz cylinder 263, support ring 262 and wafer or substrate 100 are caused to rotate during processing. An additional silicon carbide adapter ring can be used to allow wafers or substrates of different diameters to be processed (e.g., 150 millimeter, 200 millimeter or 300 millimeter wafers). The outside edge of support ring 262 may extend less than about two inches from the outside diameter of wafer or substrate 100.

Bottom wall 215 of RTP apparatus 200 includes, for example, a gold-coated top surface or reflector 211 for reflecting energy onto the backside of wafer or substrate 100. Additionally, RTP apparatus 200 includes a plurality of fiber optic probes 271 positioned through bottom wall 215 of RTP apparatus 200 to detect the temperature of wafer or substrate 100 at a plurality of locations across its bottom surface.

RTP apparatus 200 includes a gas inlet 269 formed through side wall 214 for injecting a process gas into chamber 213 to allow various processing steps to be carried out in chamber 213. The gas inlet 269 may comprise a plurality of openings extending through side wall 214 above a port or slit valve 272 through which a wafer or substrate is loaded into and removed from the process chamber. Positioned on the opposite side of gas inlet 269, in side wall 214, is a gas outlet 270. Gas outlet 270 is part of an exhaust system and is coupled to a vacuum source, such as a pump (not shown), to exhaust process gas from chamber 213 and to reduce the pressure in chamber 213. The exhaust system maintains the desired pressure while process gas, including radicals of a plasma, is continually fed into chamber 213 during processing. Specifically, a throttle valve (not shown) is set to control the chamber pressure to the desired level in relation to the total process gas flow, the process chamber size, and the pumping set point pressure for the exhaust system.

Another gas inlet 275 is formed through side wall 214 through which a plasma of a process gas may be injected into the process chamber. Coupled to gas inlet 275 is applicator 300 to inject radicals of the plasma into the process chamber.

Light pipe assembly 218 may include 187 lamps 219 positioned in a hexagonal array or in a "honeycombed" shape. Lamps 219 are positioned to adequately cover the entire surface area of wafer or substrate 100 and support ring 262. Lamps 219 are grouped in zones that can be independently controlled to provide for extremely uniform heating of wafer or substrate 100. Light pipes 221 can be cooled by flowing a coolant, such as water, between the various light pipes.

Window assembly 217 includes a plurality of short light pipes 241 that are brazed to upper/lower flange plates that have their outer edges sealed to an outer wall 244 of the light pipe assembly. A coolant, such as water, can be injected into the space between light pipes 241 to cool light pipes 241 and the flanges. Light pipes 241 register with light pipes 221 of the illuminator. The flanges with the light pipe pattern that registers with the lamp housing is sandwiched between two quartz plates 247 and 248. These plates are sealed to the respective flanges with "O" rings near the periphery of the flanges. The flanges include grooves that provide communication between the plurality of light pipes 241. A vacuum can be produced in the plurality of light pipes 241 by pumping through a tube 253 connected to one of the light pipes 241 which is in turn connected to the rest of the pipes by a very small recess or groove in the face of a flange. Thus, when the sandwiched structure is placed on chamber 213, the flanges (typically stainless steel, and of excellent mechanical strength) provide adequate structural support. Lower quartz plate 248—the one actually sealing chamber 213—experiences little or no pressure differential because of the vacuum on each side and thus can be made very thin. The adaptor plate concept of window assembly 217 allows quartz plates to be easily changed for cleaning or analysis. In addition, the vacuum between quartz plates 247 and 248 of window assembly 217 provides an extra level of protection against toxic gases escaping from the reaction chamber.

RTP apparatus 200 is a single wafer reaction chamber capable of ramping the temperature of wafer or substrate 100 at a rate of 25–100° C./second. RTP apparatus 200 is said to be a "cold wall" reaction chamber because the temperature of wafer or substrate 100 during, for example, an oxidation process is at least 400° C. greater than the temperature of chamber side wall 214. Heating/cooling fluid can be circulated through side walls 214 and/or bottom wall 215 to maintain the walls at a desired temperature.

As noted above, plasma applicator 300 is coupled to RTP apparatus 200 to provide a source of radicals of a plasma to RTP apparatus 200. In one embodiment, plasma is connected to RTP apparatus 200 by an inlet member 360. Plasma applicator 300 also includes a gas inlet 310. Coupled to gas inlet 310 is a gas source, such as a reservoir or tank 313 of nitrogen-containing gas, including, but not limited to, $N_2$ gas. Plasma applicator 300 is coupled to energy source 450 by waveguides 312a and 312b.

FIGS. 3A and 3B illustrate an embodiment wherein plasma applicator 300 is remote from RTP apparatus 200 in that the plasma is generated outside chamber 213 of RTP apparatus 200. By locating plasma applicator 300 remotely from chamber 213 of RTP apparatus 200, a plasma source can be selectively generated to limit the composition of the plasma exposed to wafer or substrate 100 to predominantly radicals. Thus, a plasma of ions, radicals, and electrons is generated in plasma applicator 300. However, because of the size (e.g., length and volume) of plasma applicator 300 or the combined size of plasma applicator 300 and inlet member 360, all or the majority of ions generated by the excitation of the process gas to form a plasma outlive their ionic lifetime and become charge neutral. Thus, the composition of the plasma that is supplied to gas inlet 275 of RTP apparatus 200 is predominantly radicals.

In the case of a nitrogen source gas, for example, excitation by microwave radiation produces a plasma of $N^*$ radicals, positively charged ions such as $N^+$ and $N^{2+}$ ions, and electrons. The $N^*$ radicals are believed to be neutral atoms occupying a high energy state. The apparatus of the invention is configured such that the positively charged ions (e.g., N⁺ and N²⁺ ions) become charge neutral either in plasma applicator 300 or inlet member 360 and thus generally do not reach chamber 213 of RTP apparatus 200. Positively charged nitrogen ions become charge neutral by combining with available electrons to lose their ionic state. In this manner, predominantly N* radicals and charge neutral nitrogen reach chamber 213 and are exposed to wafer or substrate 100, or a material on wafer or substrate 100 (e.g., an oxide layer). By combining with positively charged nitrogen ions, electrons produced in the plasma are not, in general, exposed to substrate 100 in chamber 213. Thus, charged particles of the plasma are not available to sputter substrate 100 or SiO₂ layer 110 on substrate 100. In this manner, the reaction of a nitrogen plasma of N* radicals results in a relatively damage-free dielectric layer.

FIG. 4 illustrates an embodiment of plasma applicator 300 that is useful in the remote plasma generation apparatus of the invention. Plasma applicator 300 is particularly useful in generating a nitrogen plasma according to the nitridation reaction described above with reference to FIGS. 1 and 2, and the accompanying text. Plasma applicator 300 includes a body 305 of, for example, aluminum or stainless. Body 305 surrounds a tube 320. The tube 320 is, for example, made of quartz or sapphire. (Al₂O₃) The tube 320 preferably does not have any electrical bias present that might attract charged particles, e.g., ions. One end of body 305 includes gas inlet 310.

Coupled to gas inlet 310, as noted, is gas source 313. The gas source 313 is coupled to gas inlet 310 through a first input of a three-way valve 314 (see FIG. 3A). A second input of three-way valve 314 is coupled to another process gas source, such as a reservoir or tank 315 of an oxygen-containing gas, including, but not limited to, O₂ gas. In a first position, valve 314 provides for gas flow between gas source 313 and gas inlet 310, while preventing any gas flow from gas source 315 to process chamber 213. The valve 314, in a second position, provides for gas flow between gas source 315 and process chamber 213, while preventing gas flow from gas source 313 to gas inlet 310 of the applicator.

Thus, in one position, valve 314 allows, for example, an oxygen-containing gas to be introduced into the process chamber for oxidation of the substrate or wafer, and in a second position, allows a nitrogen-containing gas to be introduced into the process chamber for nitridation of the substrate or wafer.

A flow controller 425 is connected to valve 314 to switch the valve between its different positions, depending upon which process is to be carried out. The flow controller can function as a mass flow controller and be coupled between source gas 313 and gas inlet 310 to regulate the flow of gas to plasma applicator 300. Flow controller 425 receives, in one embodiment, an analog signal from system controller 260 (such as, for example, a signal between 0 and 5 volts) that puts valve 314 in the proper position to allow for gas flow from gas source 313 into applicator 300 and actuates a value 316 to control the flow rate or amount of gas released from source gas 313 to gas inlet 310. The diameter of the opening of gas inlet 310 is also selected to allow a desired flow rate of source gas 313 into tube 320. Conversion board 272 is placed, in this embodiment, between flow controller 425 to coordinate the signals between system controller 260 and the flow controller in the instance where, for example, the signals are scaled differently.

The flow controller 425 also functions in a similar fashion to control valves 314 and 317 to provide an appropriate process gas flow from gas source 315 to the process chamber.

Positioned on the opposite side of gas inlet 310 is a radicals outlet 375. Radicals outlet 375 is coupled to inlet member 360 to supply, in one embodiment, radicals of a plasma 350 to chamber 213 of RTP apparatus 200. Radicals outlet 375 typically has a diameter larger than gas inlet 310 to allow the excited radicals to be efficiently discharged at the desired flow rate and to minimize the contact between the radicals and tube 320. The flow rate of the radicals generated and discharged by plasma applicator 300 is determined primarily by the source gas inlet flow, the dimensions of tube 320 and radical outlet 375, and the pressure in plasma applicator 300.

A separate orifice may be inserted into tube 320 at radicals outlet 375 to reduce the tube's inside diameter. The orifice may be made of sapphire or alumina (Al₂O₃). The diameter of the orifice is selected to optimize the pressure differential between the process chamber and the applicator for nitridation efficiency.

The pressure in the process chamber should be less than the pressure in the applicator. The pressure in the process chamber may be between about 0.50 and 4.0 Torr, while the pressure in the applicator may be between about 1.0 and 8.0 Torr. For example, if the pressure in the applicator is about 2.00 Torr, then the pressure in the process chamber should be about 1.00 Torr.

At a position between gas inlet 310 and radicals outlet 375 of body 305 is energy source inlet 380. Energy source inlet 380 allows the introduction into tube 320 of excitation energy, such as an energy having a microwave frequency, from energy source 450. In the case of a microwave frequency, the excitation energy moves into body 305 of plasma applicator 300 and through tube 320 to excite the gas source traveling in a direction perpendicular to energy source inlet 380 into a plasma. The excitation energy does this by disrupting the otherwise stable configuration of some of the gas molecules into excited or higher energy states such as certain radicals and ions. In the case of $N_2$, for example, the microwave excitation in plasma applicator 300 produces N* radicals, positively charged ions such as N⁺ and N²⁺, and electrons.

One goal of the system and method of the invention is to minimize the reaction of ions of a plasma (e.g., N⁺ and N²⁺ ions) with substrate 100 or the oxide overlying the surface of substrate 100. Thus, in one embodiment, tube 320 of plasma applicator 300 is constructed of a length such that, for a given flow rate of a process gas (e.g., a given plasma generation rate), substantially all ions created by the excitation by the energy source are extinguished or reacted with electrons or other charged particles to lose their excited state prior to exiting tube 320. In one embodiment, a plasma of predominantly radicals is delivered to substrate 100 in chamber 213. It is to be appreciated that in some instances, a small amount of ions of a plasma may be delivered to the substrate site without significant effect on the reaction between the radicals and the substrate or the radicals and material on the substrate. The invention recognizes that radicals tend to react in a much more desirable manner then ions or a mixture of radicals and ions. Accordingly, the invention seeks, in one aspect, to minimize the exposure of the substrate or the material on the substrate to ions.

The length of tube 320 and inlet member 360 necessary to extinguish substantially all the ions of a plasma at a given source gas flow rate may be determined experimentally or by lifetime calculations. In one embodiment, tube 320 has a length of 12 inches with a one inch inside diameter, including a one inch diameter radicals outlet 375 to produce a plasma of predominantly N* radicals and inert nitrogen at a source gas flow rate of 300 cubic centimeters per minute at radicals outlet 375. In another embodiment, the excitation lifetime of ions is accounted for not only in plasma applicator 300 but also in inlet member 360 coupling plasma applicator 300 to RTP apparatus 200.

An applicator which may be used in the system and method of the invention is available from Applied Komatsu Technology, Inc., Sunnyvale, Calif.

As shown in FIGS. 3A and 5–6, inlet member 360 may be configured as an adapter which is coupled to an opening in side wall 214 of the process chamber. The opening may be a preexisting opening for a camera used in monitoring a process conducted in the process chamber. If a monitoring camera is required, it can be placed at a different location in the process chamber side wall.

The inlet member 360 includes a flange 360a which is bolted to applicator 300 so a passageway 360b in the inlet member is aligned with and coupled to tube 320 at radicals outlet 375. A second flange 360c is bolted to exterior surface 214a of side wall 214 of the process chamber. The nose 360d of inlet member 360 extends into the chamber side wall opening such that an outermost face 360e of the nose is substantially flush with interior surface 214b of process chamber side wall 214.

As shown, when used with Applied Materials RTP Centura™, face 360e is curved to match the curvature of the process chamber interior side wall. Also, the dimension $l_1$ is selected to be substantially the same as the wall thickness of the side wall of the process chamber. Thus, $l_1$ may equal about 1.25 inches. The dimension $l_2$ is about 2.25 inches. The inside diameter d of passageway 360b may be about 0.69 of an inch. The inside diameter of passageway 360b, in another embodiment, may be made equal to the diameter of tube 320.

The inlet member 360 may be made of aluminum. A sleeve 360f may be positioned in passageway 360b. The sleeve should be made of a material that does not cause recombination of the N* radicals. The sleeve should also reduce contamination that might be produced in the process chamber as the result of the plasma flowing through the inlet member. The sleeve can make made of, for example, silicon, silicon nitride, boron nitride, carbon nitride, or sapphire or alumina ($Al_2O_3$)

The sleeve can also be used to optimize the pressure differential between the applicator and the process chamber. The sleeve may reduce the inside diameter of passageway 360b to about 0.55 of an inch.

An alternate embodiment of inlet member 360 is shown in FIG. 7. This inlet member 370 includes two passageways 370ab and 370bb which diverge from main inlet member passageway 370b. By changing the geometry of the passageway in this fashion, the plasma is more uniformly distributed across the surface of a substrate or wafer processed in the process chamber. Thus, nitridation is more uniform across the substrate surface. The inlet member 370, in all other respects, is substantially the same as inlet member 360.

Yet another embodiment of an inlet member is shown in FIGS. 8A and 8B. This inlet member 380 includes a central, inner passageway 380a which terminates in a face or faceplate 380b. The faceplate 380b provides a showerhead-like arrangement which can include any appropriate number of openings 380c. The openings 380c can be uniform in size or be of different sizes. The openings may be uniform in shape or have various shapes. The openings, for instance, may be circular, oval, square, or rectangular in shape. The inlet member 380 is configured to produce a more uniform nitridation profile across the substrate surface.

In one embodiment, as shown in FIG. 3A, energy source 450 consists of a magnetron 420, and an isolator and dummy load 425, which is provided for impedance matching. Magnetron 420 generates an excitation energy, such as for example, an electromagnetic or inductively coupled frequency. The magnetron can generate between 1.5 and 6.0 kilowatts of 2.54 GHZ of microwave energy. A suitable magnetron assembly can be obtained from Applied Sciences and Technology, Woburn, Mass., or Daihen America, Santa Clara, Calif.

The excitation energy from magnetron 420 is directed through isolator and dummy load 425, and waveguides 312a and 312b to tube 320. Dummy load 425 acts, in one sense, like a check valve to allow energy flow in a direction toward applicator 300 but not toward magnetron 420.

Between plasma applicator 300 and waveguide 312b is autotuner 400. The autotuner redirects radiation reflected from applicator 300 back toward the plasma applicator to increase the energy supplied to plasma applicator 300. Autotuner 400 also focuses the microwave energy into the center of tube 320 so that the energy is more preferentially absorbed by the gas fed to the applicator. Although an autotuner is preferred, a manual tuner may be used.

With reference to FIG. 3A, control signal generation logic 252 is supplied to system controller 260 in the form of, for example, software instruction logic that is a computer program stored in a computer-readable medium such as a memory 238 in system controller 260. Preferably, memory 238 is a hard disk drive, but memory may also be other kinds of memory. The computer program includes, among other things, sets of instructions that dictate the timing, gas flow rate, chamber pressure, chamber temperature, RF power level, energy source regulation and other parameters of a particular process. It is to be appreciated that other computer programs such as one stored on another memory device, including, but not limited to, a floppy disk, may also be used to operate system controller 260. The computer program is processed by system controller 260 in a processor 250. The interface between a user and system controller 260 may be implemented, for example, via a cathode ray tube (CRT) monitor or monitor with command instruction implemented by an interface such as keyboard, mouse, light-pen center or touch screen monitor.

FIG. 9 shows an illustrative block diagram 400 of the hierarchical control structure of control signal generation logic 252, according to one embodiment of the invention. In a multi-process chamber environment, for example, a user enters a process set number and process chamber number into process selector subroutine 473 in response to menus or screens displayed on the CRT monitor. The process sets are predetermined sets of process parameters necessary to carry out specified processes, and identified by predefined set numbers. Process selector subroutine 473 identifies (I) the desired process chamber and (ii) the desired set of process parameters needed to operate the process chamber for performing the desired process. The process parameters for performing a specific process relate to process conditions such as, for example, process gas flow rate, temperature, reaction pressure, cooling gas pressure and chamber wall temperature, and are provided to the user in the form of a recipe. The parameters specified by the process recipe are entered using the CRT monitor interface. The signals for monitoring the process are provided by the analog input and digital input for system controller 260, and the signals for controlling the process are output on the analog output and digital output boards of system controller 260.

Process sequencer subroutine 475 shown in FIG. 9 includes, in one embodiment, program codes for accepting the identified process chamber and set of process parameters from process selector subroutine 473 and for controlling the operation of the process chamber. Multiple users can enter process set numbers and process chamber numbers, or a user can enter a multiple process set numbers and process chamber numbers, so process sequencer subroutine 475 operates to schedule the selected processes in the desired sequence. Process sequencer subroutine 475 includes a program code to perform the steps of (i) monitoring the operation of the process chambers to determine if the chambers are being used, (ii) determining what processes are being carried out in the chambers being used, and (iii) executing the desired process based on the availability of the process chamber and type of process to be carried out. Conventional methods of monitoring the process chambers can be used, such as pooling. When scheduling which process is to be executed, process sequencer subroutine 475 can be designed to take into consideration the condition of the process chamber being used in comparison with the desired process condition for a selected process, or the "age" of each particular user-entered request, or any other relevant factor a system programmer desires to include for determining and scheduling priority.

Once process sequencer subroutine 475 determines which process chamber and process set combination are to be executed next, process sequencer subroutine 475 causes the execution of the process set by passing the particular process set parameter to chamber manager subroutine 477a–477c that controls multiple processing tasks in a process chamber according to the process set determined by process sequencer subroutine 475. For example, chamber manager subroutine 477a includes program code for controlling the flow rate of process gas/plasma into process chamber 213 (through plasma applicator 300). Chamber manager subroutine 477a also controls execution of various chamber component subroutines that control the operation of chamber components necessary to carry out the selected process set. Examples of chamber component subroutines are process gas control subroutine 483, pressure control subroutine 485, and heater control subroutine 487. It is to be appreciated that other chamber control subroutine may be included depending on the process demand.

In operation, chamber manager subroutine 477a shown in FIG. 9 selectively schedules or calls the process component subroutine in accordance with the particular process set being executed. Chamber manager subroutine 477a schedules the process component subroutine similarly to the way the process sequencer subroutine 475 schedules which process chamber and process set are to be executed next. Typically, chamber manager subroutine 477a includes the steps of monitoring the various chamber components, determining which component needs to be operated based on the process parameter for the process set to be executed and causing execution of a chamber component subroutine responsive to the monitoring and determining steps.

Process gas control subroutine 483 has program code for controlling the process gas composition and flow rate. Process gas control subroutine 483 controls the open/close position of a safety shut-off valve, and also ramps up/down the flow controller to obtain the desired gas flow rate. As noted above, the flow rate of process gas into plasma applicator 300 will partly determine the flow rate of radicals of a plasma delivered to substrate 100 in chamber 213. Accordingly, parameters considered in process gas control subroutine include, but are not limited to, the volume of tube 320 and the distance between the plasma generation point in tube 320 and substrate 100. Process gas control subroutine 483 is invoked by chamber manager subroutine 477a as are all chamber component subroutines, and receives from chamber manager subroutine 477a process parameters related to the desired gas flow rate. Typically, process gas control subroutine 483 operates by putting vale 314 in its proper position and opening the gas supply line (by actuating flow controller 425) to begin the flow of gas into plasma applicator 300, and repeatedly (I)reading the necessary flow controller, (ii) comparing the reading to the desired flow rate received from chamber manager 477a, and (iii) adjusting the flow rate of the source gas 313 as necessary. Further, process gas control subroutine 483 includes the steps of monitoring the gas flow rate for unsafe rates and activating the safety shut-off valve when an unsafe condition is detected.

Pressure control subroutine 485 shown in FIG. 9 includes program code for controlling the pressure in chamber 213 by regulating the size of the opening of the throttle valve in the exhaust system of chamber 213. When pressure control subroutine 485 is invoked, the desired target pressure level is received as the parameter from chamber manager subroutine 477a. Pressure control subroutine 485 operates to measure the pressure in chamber 213 by reading one or more pressure meters connected to the chamber, comparing the measured value(s) to the target pressure, obtaining PID (proportional, integral, and differential) values from a stored pressure table corresponding to the target pressure, and adjusting the throttle valve according to the PID value obtained from the pressure table.

Alternatively, pressure control subroutine 485 can be written to open or close the throttle valve to a particular opening size to regulate chamber 213 to the desired pressure. Heater control subroutine 487 includes program code for controlling the current to light pipe assembly 218 that is used to heat substrate 100 in chamber 213. Heater control subroutine 487 is also invoked by chamber manager subroutine 477a and receives a targeted setpoint temperature parameter.

Heater control subroutine 487 measures the temperature by temperature signals delivered from fiber optic probes 271, compares the measured temperature to the set point temperature, and increases or decreases the current applied to light pipe assembly 218 to obtain the set point temperature. The temperature is obtained from the measured value by looking upon the corresponding temperature in a stored conversion table or by calculating the temperature using a fourth order polynomial.

In addition to passing information to a particular chamber manager subroutine, such as chamber manager subroutine 477a, process sequencer subroutine 475 causes the execution of the process set by passing the particular process set parameter to energy source manager subroutines 478a–478c that control multiple processing steps associated with energy source 450 determined by process sequencer subroutine 475. For example, energy source manager subroutine 478a includes program code for controlling the generation of excitation energy. Energy source manager subroutine 478a may also monitor dummy load 425 and tuner 400 to verify that any reflected energy is redirected toward plasma applicator 300 to increase the energy supply to plasma applicator 300.

The process for controlling the flow of process gas to chamber 213 can be implemented using a computer program product that is executed by system controller 260. A computer code can be written in a computer readable programming language, such as for example, 68000 assembly language C, C++, Pascal, Fortran, or others. Suitable program code is generally entered in a single file or multiple files, using a text editor, and stored or embodied in a computer usable medium, such as the memory system of a computer. As the entered code text is in a high level language, the code is compiled, and the resultant compiler code is then linked with an object code of precompiled object code. The system invokes the object code, causing the computer system to load the code in memory, from which the central processing unit (CPU)reads and executes the code to perform the task identified in the program.

A method of generating a plasma of radicals in a process chamber according to an embodiment of the invention is illustrated in flow chart 500 of FIG. 10. The method of this embodiment will be described with respect to a nitrogen plasma reaction process using the remote plasma system described in FIGS. 3A–3B and 4. Additionally, the remote plasma generation process of the invention will be described with respect to the reaction of nitrogen radicals with an $SiO_2$ layer, such as a gate oxide, on silicon wafer or substrate 100 as illustrated in FIGS. 1 and 2. Such a process might be used, for example, to create gate dielectrics having an appropriate dopant barrier layer for high performance transistor devices.

The formation of a layer of $SiO_2$ may be accomplished in the same reaction chamber as the plasma nitridation reaction of the invention. Alternatively, $SiO_2$ formation may be accomplished in one chamber, while the plasma nitridation reaction takes place in a second chamber. The two chambers may be joined to each other via a load-lock.

Prior to initiating the process, however, the leak rate for the chamber in which the nitridation reaction takes place is determined. Specifically, the leak rate should be relatively low, for example, less than about 3 to 4 milliTorr per minute to ensure that the nitridation process is effective. The leak rate for a particular process chamber is determined by pumping the chamber down to a very low pressure, for example, about 30 milliTorr, and then isolating the chamber from the pump. Then, after a certain period of time, for example, about 10 to 30 minutes, the pressure in the chamber is measured to determine the leak rate. If the leak rate exceeds the predetermined minimum, then the chamber leaks, such as would occur at the vacuum seals, need to be eliminated or reduced.

If the processes are carried out in the same chamber, the first process step, as set forth in block 502 of FIG. 10, is to move wafer or substrate 100 into chamber 213. Wafer or substrate 100 can generally be transferred by a robotic arm from a load lock through slit valve 272 and placed onto support ring 262 located in chamber 213. Wafer or substrate 100 will generally be transferred into chamber 213 having an inert $N_2$ ambient at a transfer pressure of approximately 20 Torr. Chamber 213 is then sealed. Next, the pressure in chamber 213 is further reduced by evacuating the $N_2$ ambient through gas outlet 270. Chamber 213 is evacuated to a pressure sufficient to remove the $N_2$ ambient.

In accordance with this embodiment of the invention, silicon wafer or substrate 100 is oxidized to form a layer of $SiO_2$ by one of several known processes. For example, the oxidation may be carried out in a 100% oxygen ($O_2$) or dry $O_2$ environment at 1050° C. for 50 seconds to yield an oxide layer having a thickness of 50 Å. Alternatively, the process gas may include a reactant gas mixture comprising two reacting gases: a hydrogen-containing gas and an oxygen-containing gas that can be reacted together to form steam or water vapor at temperatures between 400–1250° C. The hydrogen-containing gas may be hydrogen (H), or other hydrogen-containing gases such as, but not limited to ammonia ($NH_3$), deuterium (heavy hydrogen), and hydrocarbons such as methane ($CH_4$). The oxygen-containing gas is preferably an $O_2$ gas but may be other types of oxygen-containing gases such as, but not limited to, nitrous oxide ($N_2O$).

It has been found that the addition of a hydrogen-containing gas to an oxygen-containing gas increases the oxidation rate on the substrate. This increased rate is particularly noted by carrying out the reaction of the hydrogen-containing gas and the oxygen-containing gas inside chamber 213 or "in situ". The gases are caused to react at or near the substrate by the heat generated by wafer or substrate 100. Accordingly, the oxygen-containing gas and the hydrogen-containing gas are mixed together in chamber 213 to form the reacting gas mixture with the partial pressure of the reacting gas mixture (i.e., the combined partial pressure of the hydrogen-containing gas and the oxygen-containing gas) controlled to ensure safe reacting conditions. Such safe reacting conditions are maintained by back filling chamber 213 with process gas such that the partial pressure of the reacting gas mixture is less than the partial pressure at which spontaneous combustion of the entire volume of the desired concentration ratio of reacting gas will not produce a detonation pressure wave of a predetermined amount. The predetermined amount is the amount of pressure that chamber 213 can reliably handle without failing. An in situ method such as described using 1% $H_2$ gas and 99% $O_2$ gas for 10 seconds will produce oxide on a silicon wafer or substrate 100 having a thickness of 30 Å at a temperature of 950°.

In addition to the in situ process described above, one oxidation process particularly useful for a gate oxide is the oxidation of wafer or substrate 100 by an oxygen-containing gas of $N_2O$. $N_2O$ forms an acceptable oxide at 1050° C. (e.g., 40 Å in 60 seconds). One advantage of using an oxygen-containing gas of $N_2O$ is that the $N_2O$ oxidation places approximately 0.5% of nitrogen-containing material at interface 105 of $SiO_2$ layer 110 and silicon substrate 100. It has been determined that the presence of nitrogen in the range of about 0.5% at the dielectric layer/silicon interface suppresses hot channel carriers, i.e., carriers moving through a transistor channel that might penetrate the gate dielectric. Thus, the presence of nitrogen in amounts around 0.5% at the interface improves the oxide integrity and reliability.

Once the desired $SiO_2$ layer 110 is formed, chamber 213 of RTP apparatus 200 is cooled and purged in preparation for the nitridation reaction.

Next, the reaction temperature of the nitridation reaction is established as set forth in Step 503 of FIG. 10. Power to lamps 219 is increased to ramp-up the temperature of wafer or substrate 100 to process temperature. Wafer or substrate 100 is preferably ramped from the stabilization temperature to process temperature at a rate between 10–100° C./second. The process temperature for nitridation of oxide may be about 600° C. It is to be appreciated, however, that the nitridation can be accomplished at various process times and temperatures, including from about room temperature to about 1,100° C.

Next, as set forth in block 504 of FIG. 10, the power to energy source 450 is set and the appropriate frequency, such as for example, a microwave frequency of 2.45 gigahertz is established. Excitation energy is then supplied to plasma applicator 300 through energy source inlet 380 in plasma applicator 300. Next, as set forth in block 506, a nitrogen source gas is introduced into plasma applicator 300 at a desired flow rate. The nitrogen process gas moves through tube 320 and past energy source inlet 380. The process gas proceeds through inlet member 360 into chamber 213. As the nitrogen source gas passes energy source inlet 380, the excitation energy supplied by energy source 450 converts the nitrogen source gas to nitrogen plasma in tube 320 of plasma applicator 300 (Step 508). The nitrogen plasma is predominantly N* radicals, positively charged nitrogen ions, and electrons. In general, the positively charged ions have a shorter life than uncharged N* radicals. It is believed that the positively charged nitrogen ions quickly seek out electrons present in the plasma and combine with the electrons in tube 320 to become charge neutral (Step 510).

According to the invention, when the plasma is transferred from plasma applicator 300 to chamber 213 of RTP apparatus 200 and to the surface of the substrate, the plasma is made up primarily of charge neutral gas and plasma radicals. The plasma radicals predominantly react or interact with $SiO_2$ layer 110 on wafer or substrate 100 (step 512) of FIG. 9. Any electrical bias present in chamber 213 of RTP apparatus 200 is discontinued as any electrical bias may attract positively charged nitrogen ions into chamber 213. Once the bias is eliminated, if present, and the stabilization temperature and the pre-reaction pressure are reached, chamber 213 is backfilled with the desired mixture of process gas, i.e., radicals (step 514). In the case of a nitrogen plasma, the nitrogen in the plasma available for reaction with $SiO_2$ layer 110 are N* radicals.

As set forth in block 518, once the reaction temperature is reached, the nitridation reaction is held for an appropriate reaction time, in this case, an appropriate reaction time to incorporate enough nitrogen in a gate oxide to act as a barrier layer to gate dopants. Process time and temperature are generally dictated by the amount of nitrogen desired to be incorporated into the gate oxide, the thermal budget, the purpose of the nitridation, and the amount of flow rate of the process gases.

Next, as et forth in block 520, power to lamps 219, if on, is reduced or turned off to reduce the temperature of wafer or substrate 100. The temperature of wafer or substrate 100 decreases (ramps down) as fast as it is able to cool down (at about 50° C./second). Simultaneously, $N_2$ purge gas is fed into chamber 213. In general, the nitridation reaction ceases when the radicals of the plasma are no longer present. Thus, the nitridation reaction does not significantly continue in the presence of the $N_2$ purge gas. The chamber is then backfilled with $N_2$ gas to the desired transfer pressure of approximately 20 Torr and wafer or substrate 100 is transferred out of chamber 213 to complete the process (Step 522). At this time, a new wafer or substrate may be transferred into chamber 213 and the process set forth in flow chart 500 repeated.

FIG. 11 shows a Secondary Ion Mass Spectroscopy (SIMS) profile of a silicon substrate containing a dielectric layer formed by nitridation of an oxide film as described above. The SIMS profile of FIG. 10 illustrates the atomic profile of a dielectric from the surface (0 depth) to the interface of the dielectric layer and the silicon substrate. Thus, the depth represents the depth into the dielectric layer.

FIG. 11 shows the profile of a nitrogen-containing dielectric material formed on a silicon wafer or substrate according to a first set of reaction conditions. In this case, the nitridation is carried out on a wafer having a $SiO_2$ layer. The plasma nitridation according to the invention is carried out at 550° C. for 240 seconds at 1.10 Torr process pressure. The nitrogen plasma is produced by the addition to plasma applicator 300 of an $N_2$ gas at a flow rate of 3 standard liters per minute (SLM). Plasma applicator 300 includes a quartz tube (tube 320) of 12 inches with a one inch diameter. The overall length $l_2$ of inlet member 360 is about 2.25 inches, and it includes sleeve 360f with an inside diameter of about 0.55 of an inch. The N* radicals are produced through contact with an excitation energy of a microwave frequency (2.45 gigahertz frequency) generated at a power of approximately 3000 watts. The process gas flow rate, inlet member 360 and plasma applicator 300 are determined and sized, respectively, so that substantially all of the positively charged ions generated by the plasma become charge neutral in the plasma applicator.

FIG. 11 illustratively shows that the majority of the nitrogen-containing material present in the dielectric layer (and attributable to the nitrogen plasma reaction) is toward the surface of the dielectric layer (i.e., within 15 Å of the surface of the dielectric layer) and not at the dielectric layer/silicon substrate interface.

FIG. 12 schematically illustrates a side view of a dielectric layer 620 formed on a substrate or wafer 600 using a plasma nitridation process in accordance with the first set of reaction conditions. FIG. 12 shows that dielectric layer 620, having an overall thickness of approximately 22 Å, has the highest concentration of nitrogen within 15 Å of the surface of dielectric layer 620.

A common way to measure the thickness of dielectric layer 620 is by measuring the speed of a light ray through dielectric layer 620. Since an $SiO_2$ dielectric material has a known refractive index (approximately 1.46), the change in the speed of the light ray through an $SiO_2$ dielectric layer provides a determination of the thickness of the dielectric layer.

One theory of the nitridation reaction of the invention is that N* radicals displace oxygen atoms and form $Si_3N_4$ and $Si_xN_yO_z$ molecules. $Si_3N_4$ and $Si_xN_yO_z$ have a refractive index greater than $SiO_2$. Thus, the effect of a nitridation reaction will produce a change in the apparent thickness of dielectric layer 620. The change is referred to as "apparent", because, although the actual thickness may be similar before and after a nitridation reaction that results in the replacement of oxygen atoms, there will be a change in the refractive index and the change in the refractive index of the material will effect the thickness measurement.

A measurement of the areal density of the nitrogen containing material in the surface of dielectric layer 620 shows an areal density measurement of nitrogen of 8.1E14/ $cm^2$. An areal density measurement determines the amount of nitrogen present in the surface area of dielectric layer 620.

The method described above with respect to flow chart 500 (FIG. 10) may be modified by mixing helium with nitrogen and forming a plasma of that source gas. The addition of helium produces a hotter plasma which increases nitridation. Helium may comprise up to about 95 percent of this gas source. Specifically, helium may comprise about 20 to 80 percent of the gas source, and more specifically, it may comprise about 50 to 80 percent of the gas source. Another inert gas, such as xenon, may possibly be used in place of helium.

As noted above, the method may also be run at different process temperatures. For instance, a "built-in" anneal is provided if the nitridation process is carried out at about 1,000° C. or even at 1,100° C. The temperature at which this effect is produced is a function of the nitridation process time. Thus, for process times between about 60 to 300 seconds, the nitridation process may be carried out at temperatures between about 800 and 1,100° C. to provide the "built-in" anneal.

The process temperature and the use of helium may be thought of as critical "knobs" for controlling the nitridation profile.

FIG. 13 shows the SIMS profile of a nitrogen-containing dielectric layer formed on a silicon substrate or wafer with a plasma nitridation of $SiO_2$ under a second set of reaction conditions. The plasma nitridation of FIG. 13 takes place at 550° C. for 240 seconds at a process pressure of 1.15 Torr. The plasma is produced by flowing a mixture of $N_2$ and He (20 percent He) as the process gas at a flow rate of 3 SLM through plasma applicator 300 (12 inch length, one inch diameter) and inlet member 360 (2.25 inch length, 0.55 inch diameter), and exposing the gas mixture to an excitation energy having a microwave frequency (2.45 gigaHertz frequency) at approximately 3000 watts power. The process gas flow rate, inlet member 360 and plasma applicator 300 are determined and sized, respectively, so that substantially all of the positively charged nitrogen ions generated by the plasma become charge neutral in plasma applicator 300. The nitridation reaction with the $SiO_2$ layer is carried out, in this example, for 240 seconds. FIG. 13 shows that the plasma nitridation results in the majority of the nitrogen-containing material being present at the surface of the dielectric layer (i.e., within 15 Å of the depth of the approximately 22 Å thick dielectric layer) not at the dielectric layer/silicon wafer interface.

FIG. 14 schematically illustrates a side view of a dielectric layer 720 formed on a wafer 700 using a plasma nitridation process in accordance with thesecond set of reaction conditions. A 22 Å thick dielectric layer 720 has the highest concentration of nitrogen containing material (presumably in the form of $Si_3N_4$ and $Si_xN_yO_z$) within 15 Å of the surface of dielectric layer 820. An areal density measurement of nitrogen in the surface of dielectric layer 720 is $1.1E15/cm^2$.

FIGS. 13 and 14 also show that the nitrogen concentration is much greater near the surface of the dielectric layer than in the case of the process of FIG. 11. This is due to the addition of He to the process gas which increases nitridation.

FIG. 15 shows the SIMS profile of a nitrogen-containing dielectric layer formed on a silicon substrate or wafer with a plasma nitridation of $SiO_2$under a third set of reaction conditions. The plasma nitridation of FIG. 15 takes place at 1000° C. for 240 seconds at a process pressure of 1.10 Torr. The nitrogen plasma is produced by flowing a $N_2$ process gas of 3 SLM through plasma applicator 300 (12 inch length, one inch diameter) and inlet member 360 (2.25 inch length, 0.55 inch diameter), and exposing the $N_2$ gas to an excitation energy having a microwave frequency (2.45 gigaHertz frequency) at approximately 3000 watts power. The process gas flow rate, inlet member 360 and plasma applicator 300 are determined and sized, respectively, so that substantially all of the positively charged nitrogen ions generated by the plasma become charge neutral in plasma applicator 300. The nitridation reaction with the $SiO_2$ layer is carried out, in this example, for 240 seconds. FIG. 15 shows that nitridation profile can be changed by running the process at a higher temperature. This plasma nitridation results in the majority of the nitrogen-containing material being present throughout the depth of the approximately 22 Å thick dielectric layer.

FIG. 16 schematically illustrates a side view of a dielectric layer 820 formed on a wafer 800 using a plasma nitridation process in accordance with the third set of reaction conditions. A 22 Å thick dielectric layer 820 has a high concentration of nitrogen containing material (presumably in the form of $Si_3N_4$ and $Si_xN_yO_z$) throughout its entire depth. An areal density measurement of nitrogen in the surface of dielectric layer 920 is $2.5E15/cm^2$.

The above reactions demonstrate that a nitridation of an oxide can be effectively produced with a plasma of predominantly of radicals (e.g., N*). In addition, the reactions demonstrate that a nitridation by radicals (e.g., N*) results in an effective barrier layer being placed at the surface of the oxide and not at the interface between the oxide and the silicon wafer or substrate. In this manner, a plasma nitridation process that results in the formation of a barrier layer at the surface of the dielectric allows the incorporation of a barrier layer into, for example, a gate dielectric, that does not degrade transistor device performance. Because the reaction occurs primarily between N* radicals and oxide ($SiO_2$), the nitridation (or the formation of the barrier layer) may be accomplished rapidly and, in one embodiment, without the addition of heat. Accordingly, the plasma nitridation with N* radical offers a manner of incorporating a barrier material on an oxide that does not require a significant thermal budget.

The above invention has been described with reference to a nitrogen plasma reaction with an oxide ($SiO_2$) or other material on a silicon substrate or wafer. As noted, however, the techniques described are not to be limited to nitridation of a material on a silicon substrate or wafer. Instead, the techniques may be used whenever plasma incorporation processes are practiced with a view towards efficiently incorporating the material and managing a thermal budget. In general, the invention recognizes the effectiveness of reacting a plasma of predominantly radicals with a substrate or a material on a substrate.

When the nitridation process is performed on a wafer or substrate with a gate $SiO_2$ on it, large amounts of nitrogen can be incorporated into the $SiO_2$ film. The optical properties of the $SiO_2$ film change due to the presence of the nitrogen. This change in optical properties can be used as a process monitor. If an ellipsometry is used with $SiO_2$ film constants to measure the nitrided $SiO_2$ layer, there is a thickness increase over and above that of the same un-nitrided film due to the presence of the nitrogen. This optical thickness increase or delta has been shown to correlate with the nitrogen dose as measured by SIMS, as shown by FIG. 17. Since SIMS is an expensive and time consuming test, this correlation process is a very useful tool for process development and process control in a manufacturing environment.

An embodiment of the above-discussed process monitor is the use of an "in-situ" ellipsometry—in a cool down chamber coupled to the process chamber, for example—which can perform an optical thickness measurement immediately after the nitridation process has been completed. The thickness data can then be converted to nitrogen dose information by system controller 260. The ellipsometry will also be useful in measuring very thin gate oxides that are grown in the process chamber prior to nitridation. Consistent measurement of these films after the process, prior to breaking vacuum, is potentially very important.

A novel apparatus and method for incorporating a plasma have been described.

What is claimed is:

1. An apparatus comprising:
   a first reaction chamber having an outlet;
   a gas source coupled to the first reaction chamber to supply a gas to the first reaction chamber comprising constituents adapted to react with a substrate in a process step;

an excitation energy source coupled to the first reaction chamber to generate a plasma comprising ions and radicals from the gas; and a second reaction chamber adapted to house a substrate at a site in the second reaction chamber wherein the first reaction chamber is coupled to the second reaction chamber by an inlet member and radicals of the plasma flow from the outlet of the first reaction chamber through a passageway of the inlet member into the second reaction chamber, an outlet of the passageway having a cross-sectional dimension that is less than a cross-sectional dimension of the outlet of the first reaction chamber such that, during processing, the pressure in the second reaction chamber is less than the pressure in the first reaction chamber.

2. The apparatus of claim 1 wherein the second reaction chamber is a rapid thermal processing chamber.

3. The apparatus of claim 2 wherein the excitation energy source includes a microwave cavity and a microwave generator to provide a microwave field to the microwave cavity.

4. The apparatus of claim 1 wherein the inlet member passageway includes a main passageway and two passageways which diverge from the main passageway in a direction toward the substrate site in the second reaction chamber.

5. The apparatus of claim 1 wherein the second reaction chamber is a rapid thermal processing chamber and the first reaction chamber is coupled to the second reaction chamber by a load lock.

6. The apparatus of claim 1 wherein tie second reaction chamber is adapted to operate at a pressure between about 0.50 and 4.0 Torr and the first reaction chamber is adapted to operate at a pressure between about 1.00 and 8.0 Torr.

7. The apparatus of claim 1 wherein the inlet member includes a main passageway and a face thereof including a plurality of openings.

8. The apparatus of claim 1 wherein the inlet member is coupled to the second reaction chamber at an inlet configured for an article other than a process gas inlet member.

9. The apparatus of claim 8 wherein the inlet of the second reaction chamber is configured for a portion of a camera.

10. An apparatus comprising:
a first reaction chamber;
a gas source coupled to the first reaction chamber to supply a gas to the first reaction chamber comprising constituents adapted to react with a substrate in a process step;
an excitation energy source coupled to the first reaction chamber to generate a plasma comprising ions and radicals from the gas; and
a second reaction charber adapted to house a substrate at a site in the second reaction chamber wherein the first reaction chamber is coupl member and radicals of the plasma flow through the inlet member into the second reaction chamber, the inlet member including a passageway having a cross-sectional dimension selected such that during processing the pressure in the second reaction chamber is less than the pressure in the first reaction chamber,
wherein the passageway of the inlet member is coupled to an output end of the excitation energy source and a sleeve is located in the passageway, the sleeve being made of a material different from that of the inlet member.

11. The apparatus of claim 10 wherein the sleeve is made of silicon, silicon nitride, boron nitride, carbon nitride, or $Al_2O_3$.

12. The apparatus of claim 10 wherein the cross-sectional dimension of the sleeve is such that during processing the pressure in the second reaction chamber is less than the pressure in the first reaction chamber.

13. An apparatus comprising:
a first reaction chamber having au outlet;
a gas source coupled to the first reaction chamber to supply a gas to the first reaction chamber including constituents adapted to react with a substrate in a process step;
an excitation energy source coupled to the first reaction chamber to generate a plasma including ions and radicals from the gas; and
a second reaction chamber adapted to house a substrate at a site in the second reaction chamber wherein the first reaction chamber is coupled to the second reaction chamber by an inlet member configured to fit within a pre-existing opening in a wall of the second reaction chamber and radicals of the plasma flow through a passageway of the inlet member into the second reaction chamber, an outlet of the passageway having a cross-sectional dimension that is less than a cross-sectional dimension of the outlet of the first reaction chamber such that, during processing, the pressure in the second reaction chamber is less than the pressure in the first reaction chamber.

14. The apparatus of claim 13, wherein the second reaction chamber is a rapid thermal processing chamber.

15. The apparatus of claim 13 where an interior wall of the second reaction chamber is curved and a face of the inlet member is curved to substantially correspond to the curvature of the interior wall.

16. The apparatus of claim 13 wherein an orifice is provided at an outlet of the first reaction chamber and a cross-sectional dimension of the orifice is selected to provide a pressure in the first reaction chamber which is greater than a pressure in the second reaction chamber during processing.

17. The apparatus of claim 13 wherein the second reaction chamber is a rapid thermal processing chamber and the first reaction chamber is coupled to the second reaction chamber by the load lock.

18. The apparatus of claim 13 wherein the opening of the second reaction chamber is configured for a portion of a camera.

19. An apparatus for nitridation, comprising:
a process chamber in which a substrate can be positioned during processing;
a first inlet into the process chamber through which a first process gas can be introduced into the process chamber from a first process gas source;
a reaction chamber having an outlet;
a second process gas source coupled to the reaction chamber to supply a second process gas thereto;
an excitation energy source coupled to the reaction chamber to generate a discharge in the second process gas as it flows from the second process gas source through the reaction chamber; and
an inlet member coupled between an outlet of the reaction chamber and a second inlet into the process chamber, the inlet member including a passageway therethrough having a cross-sectional dimension that is less than a cross-sectional dimension of the outlet of the reaction chamber such that during processing the pressure in the process chamber is less than the pressure in the reaction chamber and the inlet member is configured to fit within a pre-existing opening in a wall of the process chamber.

20. The apparatus of claim 19 wherein the first process gas is selected from the group, comprising:
   oxygen, oxygen and hydrogen, nitrous oxide and hydrogen, and a mixture of oxygen, hydrogen and nitrogen.

21. The apparatus of claim 20 wherein the second process gas is selected from the group, comprising: nitrogen, and a mixture of nitrogen and helium.

22. The apparatus of claim 19 wherein the process chamber is a rapid thermal processing chamber.

23. The apparatus of claim 22 wherein the excitation energy source includes a microwave cavity and a microwave generator to provide a microwave field to the microwave cavity.

24. The apparatus of claim 19 further including a valve to selectively provide fluid communication between the first inlet and the first process gas source, and the second inlet and the second process gas source.

25. The apparatus of claim 19 wherein the inlet member passageway includes a main passageway and two passageways which diverge from the main passageway in a direction toward an interior of the process chamber.

26. The apparatus of claim 19 wherein the inlet member includes a main passageway and a face thereof including a plurality of openings.

27. The apparatus of claim 19 wherein the opening of the reaction chamber is configured for a portion of a camera.

28. An apparatus for nitridation, comprising:
   a process chamber in which a substrate can be positioned during processing;
   a first inlet into the process chamber through which a first process gas can be introduced into the process chamber from a first process gas source;
   a reaction chamber;
   a second process gas source coupled to the reaction chamber to supply a second process gas thereto;
   an excitation energy source coupled to the reaction chamber to generate a discharge in the second process gas as it flows from the second process gas source through the reaction chamber; and
   an inlet member coupled between an outlet of the reaction chamber and a second inlet into the process chamber, the inlet member including a passageway having a cross-sectonal dimension selected such that during processing the pressure in the process chamber is less than the pressure in the reaction chamber and the inlet member is configured to fit within a pre-existing opening in a wall of the process chamber,
   wherein the inlet member passageway is coupled to an output end of the excitation energy source and a sleeve is located in the passageway, the sleeve being made of a material different from that of said inlet member.

29. The apparatus of claim 28 wherein the sleeve is made of silicon, silicon nitride, boron nitride, carbon nitride, or $Al_2O_3$.

30. The apparatus of claim 28 wherein the cross-sectional dimension of the sleeve is such that during processing the pressure in the process chamber is less than the pressure in the reaction chamber.

* * * * *